(12) United States Patent
Lee et al.

(10) Patent No.: US 8,634,241 B2
(45) Date of Patent: Jan. 21, 2014

(54) UNIVERSAL TIMING WAVEFORMS SETS TO IMPROVE RANDOM ACCESS READ AND WRITE SPEED OF MEMORIES

(75) Inventors: Peter Wung Lee, Saratoga, CA (US); Fu-Chang Hsu, San Jose, CA (US); Hsing-Ya Tsao, San Jose, CA (US)

(73) Assignee: APlus Flash Technology, Inc., Fremont, CA (US)

( * ) Notice: Subject to any disclaimer, the term of this patent is extended or adjusted under 35 U.S.C. 154(b) by 150 days.

(21) Appl. No.: 13/323,600

(22) Filed: Dec. 12, 2011

(65) Prior Publication Data
US 2012/0155173 A1 Jun. 21, 2012

Related U.S. Application Data

(60) Provisional application No. 61/459,461, filed on Dec. 13, 2010, provisional application No. 61/459,623, filed on Dec. 15, 2010.

(51) Int. Cl.
*G11C 16/06* (2006.01)

(52) U.S. Cl.
USPC ............. 365/185.09; 365/185.05; 365/230.08

(58) Field of Classification Search
USPC ........................... 365/185.09, 185.05, 230.08
See application file for complete search history.

(56) References Cited

U.S. PATENT DOCUMENTS 7,971,003 B2 * 6/2011 Cousin et al. ................. 711/141
8,295,087 B2 * 10/2012 Lee et al. .................. 365/185.17

* cited by examiner

*Primary Examiner* — Connie Yoha

(57) ABSTRACT

Methods of increasing the speed of random read and write operations of a memory device are provided for improving the performance of volatile and non-volatile memory devices. In contrast to the conventional approach that latches the current memory address right before the currently accessed memory data are outputted, the methods latch the next memory address before the currently accessed memory data are read out. The flow, timing waveforms and control sequences of applying the methods to parallel NOR flash, parallel pSRAM, serial SQI NOR flash and NAND flash are described in detail. The NOR flash device designed with the method can be integrated with a NAND flash device on a same die in a combo flash device packaged in either an ONFI compatible NAND flash package or other standard NAND flash package.

6 Claims, 38 Drawing Sheets

Combo (NAND Flash+ NOR Flash)

Parallel NOR Flash + Pseudo SRAM

PIN ASSIGNMENT (TOP VIEW)

|   | 1 | 2 | 3 | 4 | 5 | 6 | 7 | 8 | 9 | 10 |
|---|---|---|---|---|---|---|---|---|---|---|
| A | NC | NC |   |   | $\overline{LB}$ | $\overline{UB}$ |   |   | NC | NC |
| B | RDY | A21 | Vss | CLK | Vcc | $\overline{WE}$ | ACC | A19 | A17 | A22 |
| C | Vcc | A16 | A20 | $\overline{ADV}$ | NC | $\overline{RESET}$ | $\overline{WP}$ | A18 | $\overline{CEf}$ | Vss |
| D | Vss | A/DQ7 | A/DQ6 | A/DQ13 | A/DQ12 | A/DQ3 | A/DQ2 | A/DQ9 | A/DQ8 | $\overline{OE}$ |
| E | A/DQ15 | A/DQ14 | Vss | A/DQ5 | A/DQ4 | A/DQ11 | A/DQ10 | Vcc | A/DQ1 | A/DQ0 |
| F | NC | NC |   |   | $\overline{CE1ps}$ | CRE |   |   | NC | NC |

PIN NAMES

| A16 to A22 | Address inputs for Pseudo SRAM & Nor Flash Memory |
|---|---|
| A/DQ0 to A/DQ15 | Address inputs, Data Inputs/Outputs (multiplexed) Pseudo SRAM & Nor Flash Memory |
| $\overline{CE1ps}$ | Chip enable for Pseudo SRAM |
| $\overline{CEf}$ | Chip enable for Nor Flash Memory |
| CRE | Control register enable for Pseudo SRAM |
| CLK | Synchronous clock input for Pseudo SRAM & Nor Flash Memory |
| $\overline{ADV}$ | Address valid input for Pseudo SRAM & Nor Flash Memory |
| $\overline{OE}$ | Output enable input for Pseudo SRAM & Nor Flash Memory |
| $\overline{OE}$ | Write enable input for Pseudo SRAM & Nor Flash Memory |
| $\overline{LB}$ , $\overline{UB}$ | Data byte control inputs for Pseudo SRAM |
| $\overline{WP}$ | Boot block Write protection input for Nor Flash Memory |
| ACC | Program acceleration input for Nor Flash Memory |
| $\overline{RESET}$ | Hardware reset input for Nor Flash Memory |
| RDY | Wait output for Pseudo SRAM<br>Ready(Ready/busy) output for Nor Flash Memory |
| Vcc | Power supply for Pseudo SRAM & Nor Flash Memory |
| Vss | Ground |
| NC | No connection |

**Fig. 2
(Prior Art)**

Parallel NOR Flash

Synchronous burst read mode

1. Wait Count: 7 Clock Cycles
2. Burst Length = 8

NAND Flash + DRAM
PIN ASSIGNMENT (TOP VIEW)

|   | 1 | 2 | 3 | 4 | 5 | 6 | 7 | 8 | 9 | 10 |
|---|---|---|---|---|---|---|---|---|---|---|
| A | NC | DNU | | | | | | | DNU | DNU |
| B | NC | CKE1d | /REn | CLEn | Vccn | /CEn | /WEn | VDDd | VSSd | NC |
| C | VSSd | A4d | /WPn | ALEn | VSSn | R/Bn | DQ31d | DQ30d | VDDQd | VSSQd |
| D | VDDd | A5d | A7d | A9d | DQ25d | DQ27d | DQ29d | DQ28d | VSSQd | VDDQd |
| E | A6d | A8d | CKE0d | DQ18d | DQS3d | DQ22d | DM3d | DQ26d | VDDQd | VSSQd |
| F | A12d | A11d | /CS1d | DQ17d | DQ19d | DQ24d | DQ23d | DM2d | VSSQd | VDDQd |
| G | NC | /RASd | DQ15d | DQ16d | DQS1d | DM1d | DQ9d | CKd | VDDQd | VSSQd |
| H | VDDd | /CASd | DQ20d | DQ21d | DQ13d | DQ12d | DQS2d | /CKd | VSSd | VDDd |
| J | VSSd | /CS0d | BA0d | DQ14d | DQ11d | DQ10d | DQS0d | DM0d | VSSQd | VDDQd |
| K | /WEd | BA1d | A10d | A0d | DQ7d | DQ8d | DQ6d | DQ4d | VDDQd | VSSQd |
| L | A1d | A2d | A3d | DQ0d | DQ1d | DQ2d | DQ3d | DQ5d | VDDQd | VSSQd |
| M | VDDd | VSSd | A13d | NC | IO3n | IO5n | IO14n | IO7n | VSSQd | VDDQd |
| N | IO0n | IO1n | IO2n | IO10n | VCCn | IO6n | IO13n | IO15n | VDDQd | VSSQd |
| P | NC | IO8n | IO9n | IO11n | IO12n | VSSn | IO4n | VDDd | VSSd | NC |
| R | DNU | DNU | | | | | | | DNU | DNU |

PIN NAMES

| Pin Name | Pin Function (Mobil DRAM) |
|---|---|
| CKd, /CKd | Different System Clock |
| CKE0d, CKE1d | Clock Enable |
| /CS0d, /CS1d | Chip enable |
| /RASd | Row Address Strobe |
| /CASd | Column Address Strobe |
| /WEd | Write Enable |
| A0d ~ A13d | Address Input |
| BA0d ~ BA1d | Bank Address Input |
| DM0d ~ DM3d | Input Data Mask |
| DQS0d ~ DQS3d | Data Strobe |
| DQ0d ~ DQ31d | Data Input/Output |
| VDDd | Power Supply |
| VDDQd | Data Out Power |
| VSSd | Ground |
| VSSQd | DQ Ground |

| Pin Name | Pin Function (NAND Flash) |
|---|---|
| /CEn | Chip Enable |
| /REn | Read Enable |
| /WPn | Write Protection |
| /WEn | Write Enable |
| ALEn | Address Latch Enable |
| CLEn | Command Latch Enable |
| R/Bn | Ready/Busy Output |
| IO0n ~ IO15n | Data Input/Output |
| VCCn | Power Supply |
| VSSn | Ground |

| Pin Name | Pin Function |
|---|---|
| DNU | Do Not Use |
| NC | No Connection |

Fig. 13 (Prior Art)

Combo (NAND Flash+ NOR Flash)

ONFI NAND Command Set

| Command | O/M | 1st Cycle | 2nd Cycle | Acceptable while Accessed LUN is Busy | Acceptable while Other LUNs are Busy | Target level commands |
|---|---|---|---|---|---|---|
| Read | M | 00h | 30h | | Y | |
| Multi-plane | O | 00h | 32h | | Y | |
| Copyback Read | O | 00h | 35h | | Y | |
| Change Read Column | M | 05h | E0h | | Y | |
| Change Read Column Enhanced | O | 06h | E0h | | Y | |
| Read Cache Random | O | 00h | 31h | | Y | |
| Read Cache Sequential | O | 31h | | | Y | |
| Read Cache End | O | 3Fh | | | Y | |
| Block Erase | M | 60h | D0h | | Y | |
| Multi-plane | O | 60h | D1h | | Y | |
| Read Status | M | 70h | | Y | Y | |
| Read Status Enhanced | O | 78h | | Y | Y | |
| Page Program | M | 80h | 10h | | Y | |
| Multi-plane | O | 80h | 11h | | Y | |
| Page Cache Program | O | 80h | 15h | | Y | |
| Copyback Program | O | 85h | 10h | | Y | |
| Multi-plane | O | 85h | 11h | | Y | |
| Small Data Move | O | 85h | 11h | | Y | |
| Change Write Column | M | 85h | | | Y | |
| Change Row Address | O | 85h | | | Y | |
| Read ID | M | 90h | | | | Y |
| Read Parameter Page | M | ECh | | | | Y |
| Read Unique ID | O | EDh | | | | Y |
| Get Features | O | EEh | | | | Y |
| Set Features | O | EFh | | | | Y |
| Reset LUN | O | FAh | | Y | Y | |
| Synchronous Reset | O | FCh | | Y | Y | Y |
| Reset | M | FFh | | Y | Y | Y |

*O/M stands for Optional/Mandatory requirement.

Fig. 19
(Prior Art)

The add-on Combo Command Set

| Command | O/M | 1st Cycle | 2nd Cycle | Acceptable while ONFI NAND is busy | Target level commands |
|---|---|---|---|---|---|
| Read (1) | M | Code 1 | | Y | |
| Read (2) | M | Code 2 | | Y | |
| Read (3) | M | Code 3 | | Y | |
| Page Program | M | Code 4 | | Y | |
| Block Erase | M | Code 5 | Code 6 | Y | |
| Chip Erase | M | Code 7 | Code 8 | Y | |
| Page Program | M | Code 9 | Code 10 | Y | |

*O/M stands for Optional/Mandatory requirement.

(1) NOR address option 1 is up to $2^{16}$
(2) NOR address option 2 is up to $2^{32}$
(3) NOR address option 3 is up to $2^{48}$

Fig. 20

UNIVERSAL TIMING WAVEFORMS SETS TO IMPROVE RANDOM ACCESS READ AND WRITE SPEED OF MEMORIES

CROSS-REFERENCE TO RELATED APPLICATIONS

This application claims priority under 35 U.S.C. §119 to U.S. Provisional Patent Application No. 61/459,461, filed on Dec. 13, 2010, and U.S. Provisional Patent Application No. 61/459,623, filed on Dec. 15, 2010, both assigned to the same assignee as the present invention, and incorporated herein by reference in their entireties.

RELATED PATENT APPLICATIONS

U.S. patent application Ser. No. 12/807,080, filed on Aug. 27, 2010, assigned to the same assignee as the present invention, and incorporated herein by reference in its entirety.

BACKGROUND OF THE INVENTION

1. Field of the Invention

This invention relates generally to the method of reading and writing memory devices and more particularly to the control flow and timing waveforms of read and write operations for accessing memory devices.

2. Description of Related Art

Nonvolatile memory (NVM) and volatile memory (VM) are well known in the art. The different types of nonvolatile memory include read-only-memory (ROM), electrically programmable read only memory (EPROM), electrically erasable programmable read only memory (EEPROM), NOR flash, and NAND flash. In current applications such as personal digital assistants, cellular telephones, notebook and laptop computers, voice recorders, global positioning systems, etc., the flash memory has become one of the more popular types of nonvolatile memory. Flash memory has the combined advantages of high density, small silicon area, low cost and can be repeatedly programmed and erased with a single low-voltage power supply voltage source and faster speed.

Currently, the mobile market and application demands are toward very high speed, power-saving, high-density and low cost memory chips, regardless of VM and NVM. In the lower end cell phone market, a multi-chip package (MCP) combo memory with 32 Mb serial NOR flash and 16 Mb SRAM is commonly used. In the middle end of higher density cell phone market, another kind of MCP combo memory with 128 Mb parallel NOR flash and 64 Mb pSRAM is extensively used. In contrast, in the highest end smart phone market, the $3^{rd}$ kind of MCP combo memory with 32 Gb multi-level cell (MLC) NAND flash and 4 Gb DRAM has become the mainstream highest storage solution in 2010 and beyond.

The NAND flash, which is a slow serial access memory, is commonly used as a low-cost and extremely high-density audio and video data storage device. In 2010, the NAND flash density has achieved 64 Gb MLC per die made by 2×nm technology nodes. NAND flash uses FN-tunneling scheme to perform fast but low current block erase and page program operations. NAND flash is commonly encapsulated in a 48 pin package with x8 or x16 I/O pins. The most advanced node of NAND technology in production used 20 nm technology in 2010.

There are two kinds of NOR flash. One is parallel NOR and the other is serial NOR. The parallel NOR flash, which is a fast random access memory, is commonly used as a low-cost, high-density code and application program storage device. In 2010, the parallel NOR flash density has achieved only 2 Gb MLC per die made by 45 nm technology nodes. The parallel NOR flash today uses FN-tunneling scheme to perform slow block or sector erase operations but uses high current channel-hot-electron (CHE) scheme for fast byte or word program operations.

The extremely high density parallel NOR flash is available in both 56 pin and 48 pin packages, while the serial NOR is in 8 pin serial peripheral interface (SPI) or serial quad I/O (SQI) packages. The most advanced node of NOR flash technology in production used 65 nm technology in 2010.

The unique feature of EEPROM is its in-system or in-circuit low current fast re-programmability with superior 1M endurance program and erase cycles. The EEPROM is commonly used in frequently updated small byte alterable data storage in contact and contactless applications such as Smartcard, SIM-card, Bank-card and ePassport ICs, etc. It employs FN-tunneling scheme like NAND flash to perform both program and erase operations in unit of byte or page.

Unlike EPROM, two key program and erase operations of EEPROM can be performed after the sealing of the package. Due to the limitations in its largest cell size and poorest cell scalability among all NVM, the most advanced EEPROM technology node in production has used 0.15 um technology since 2010 with maximum available density of 2 Mb for embedded parallel read design but serial read in standalone 8-pin design.

EPROM is an electrically programmable memory which has been available for about 30 years since its first inception in 1980. Its market size has shrunk and become very small. EPROM has been widely replaced by NOR flash in many applications due to the lack of in-system re-programmability. EPROM is commonly used in one-time-program (OTP) applications for code or BIOS storage. The byte or word program operation of EPROM uses a CHE scheme similar to NOR flash but the chip-erase operation relies entirely on an UV-light exposure scheme. Therefore, the chip erase operation can only be performed before the sealing of the package although the program operation can be done by the programmer after the sealing of the package. Currently, available EPROM density is below 4 Mb in both parallel read and serial read packages. The most advanced technology node in production used 0.5 um technology in 2010.

The mask programmable read only memory (ROM), which is commonly called as mask ROM is the only NVM memory that does not require any high voltage (HV) devices. It uses either boron or phosphorus implant mask for programming the code data in IC fab. It is the cheapest NVM storage solution without in-system and in-circuit re-programmability. The code data change process of mask ROM takes very long time with throughput of approximately one month. Typical ROM arrays have two popular types. The cell array configured in a serial string like a NAND array uses phosphorus-implant to program the threshold voltage (Vt) of the cell from +0.7 V (non-conducting) to about −2.0 V (conducting) for serial ROM designs, while the cell array configured in a parallel string like a NOR array preferably uses boron-implant to program the threshold voltage Vt from +0.7 V (conducting) to +4.0 V (non-conducting) for parallel ROM designs.

Currently, parallel ROM density has achieved about 512 Mb in high pin count packages with x8, x16 or x32 I/Os with multiple address pins for fast random access code storage. The most advanced technology node in production used 70 nm low voltage (LV) process in 2010.

In contrast, the different types of VM memories include DRAM, SRAM and pSRAM. Unlike NVM that allows both serial and parallel access, the most popular VM memories are offering random parallel access in both read and write operations. Both DRAM and pSRAM use the same capacitor charge cells that typically require periodic refreshing within 30 ms to prevent data loss due to junction leakage happened at n-active and p-substrate bipolar junction. Each SRAM cell is comprised of six CMOS transistors (6 T) which act like a latch and therefore there is no concern with the leakage of a DRAM cell. As a result, SRAM does not require any refreshing, consuming much less power than DRAM.

SRAM is the fastest random access VM memory. SRAM stands for static-random-access Memory. It has the largest cell size in all memories because each SRAM cell is comprised of six LV CMOS transistors including three PMOS and three NMOS devices being laid out in a much larger silicon area as compared to other VM or NVM memory cells.

Because SRAM is a large LV cell, its process can be made fully logic-compatible. In 2010, the highest available density of parallel SRAM was 64 Mb, which was made by 30 nm technology node. Parallel SRAM is being used as the high speed standalone or embedded cache memory with the fastest random access speed of read and write operations of 10 ns. The only disadvantage is its high cost and expensive unit selling price due to the required large cell size made on silicon area. As a result, the SRAM market size is not as big as pSRAM and DRAM. Currently, there are many types of SRAM available with very fast random read and write speed using comparable techniques.

DRAM stands for dynamic-random-access memory. One unique feature of DRAM is that it has the smallest cell size in all VM memories because each DRAM cell is only comprised of one LV CMOS transistor (1 T) along with one capacitor being laid out in a much smaller silicon area as compared to the large 6 T SRAM memory cell.

In 2010, the highest available density of parallel-DRAM is 4 Gb, which is made by 35 nm technology node. DRAM is being used as the extremely high density random access VM memory with the random access speed slower than regular SRAM but compatible with the speed of the regular NOR flash in the same density level. For example, the random access speed of read and write operations of 2 Gb parallel DRAM is around 70-100 ns about the same as the spec of 2 Gb parallel NOR in 2010.

The advantage of DRAM is its low cost and extremely high density but its disadvantage is the high current consumption due the required periodic refreshing cycles to prevent the loss of the data charge stored in each small capacitor node in each DRAM cell. Typically, the minimum required refreshing cycle time has to be within 30 ms, depending on the density level and operating temperature. At a higher temperature operating condition, the refreshing cycle time has to be shorten due to the higher junction leakage occurring at the bipolar junction node in each cell capacitor.

pSRAM, which stands for pseudo SRAM, has a core cell similar to a DRAM cell comprised of 1 T NMOS transistor and one capacitor. There are three major differences between SRAM and pSRAM. The first one is that all the memory cells of pSRAM need to be periodically refreshed but the operation is built and embedded on the memory chip and performed in a way fully transparent to system designs. As a result, pSRAM consumes much more power than SRAM.

The second one is that the random read and write speed of pSRAM is still slower than SRAM. The third one is the address pin assignment. In conventional SRAM memory, all memory addresses of rows and columns can be coupled from system at the same time because there are sufficient address and data pins available in a SRAM die. In contrast, pSRAM is similar to DRAM and its address pins have to be used as raw addresses (RAS) before the column addresses (CAS).

In the traditional high density random access VM memories (DRAM and pSRAM), the specs of read speed are comparable to the specs of write speed and are usually defined in the same ranges between 50-70 ns when the memory density reaches above 32 Mb. In contrast, the traditional high density random access NVM memories (NAND and NOR), the specs of read and write speed are quite different. The read speed usually falls below 100 ns but the write speed is in the ms range.

The normal write operation includes two major ones such as erase and program operations. For example, the random read speed for NAND flash is usually defined with a slow page read of 20 us along with a much faster random byte read or word read of around 10-15 ns. But according to the spec, NAND flash takes about 200 us to perform a SLC FN page program operation and a few ms to perform a reverse-FN block erase operation. While the random read speed of NOR is usually defined with a faster spec between 70-100 ns in a byte read or word read operation but takes about 5 us for a byte or word program operation and also a few hundred ms for a block (64 KB) erase or small sector (4 KB) erase operation. In some NOR flash memory designs, before the erase operation, a few ms pre-program operation is usually required to achieve better control over the undesired over-erase issue and to achieve more uniform erased Vt.

As explained above, the write speed gap of the traditional NVM NAND and NOR is one or two orders slower than the VM counter parts. The speed gap of byte or word random read operations between NVM NOR and VM SRAM or pSRAM is about 2 to 3 times. For example, the fastest NOR read speed can be around 20-30 ns, while the fastest read speed of SRAM can be around 10-15 ns in the density below 32 Mb under the same operating conditions of technology node, $V_{DD}$ voltage, temperature and output capacitance loading.

For the market applications using VM memory with required density higher than 64 Mb, the lower cost pSRAM and DRAM memories are commonly used to replace SRAM. The random access read speed of both pSRAM and DRAM is much slower than SRAM. Therefore, any improvement in random read speed over the existing pSRAM and DRAM has become important in the high density VM market.

At present day flash nonvolatile memories are divided into two major product categories including the faster random access asynchronous or synchronous NOR flash and the slower serial access synchronous NAND flash. The NOR flash nonvolatile memory as presently designed has a high pin count with multiple external address and data pins along with appropriate control signal pins. One disadvantage of the NOR flash is that as the density is doubled, the number of its required external pin count increases by one.

In contrast, NAND flash has an advantage of having a smaller pin count than NOR flash with no address input pins or with 16 address pins (A0-A15) in some special NAND products. As density increases, the NAND flash pin count is always kept constant. Both main-streamed NAND flash and NOR flash nonvolatile memory today have incompatible technology process, But both cell structures in production at the present time use similar one charge retaining (charge storage or charge trapping) transistor memory cell that stores one bit of data as charge and is commonly referred to as a single-level program cell (SLC). They are respectively referred as one-bit/one transistor NAND cell or NOR cell, storing a single-level programmed data in one physical bit cell.

Both NAND and NOR flash nonvolatile memories provide the advantage of in-system and in-circuit program and erase capabilities and have a specification for providing at least 100K endurance cycles. In addition, both single-chip NAND and NOR flash nonvolatile memory products can provide giga-bit density because of their highly-scalable cell sizes. Currently, the highest density single chip double polycrystalline silicon gate NAND flash nonvolatile memory chip is 64 Gb. In contrast, a double polycrystalline silicon gate NOR flash nonvolatile memory chip has a density of 2 Gb.

The big gap between NAND and NOR flash nonvolatile memory density is a result of the superior scalability of NAND flash nonvolatile memory cell over a NOR flash nonvolatile memory. A NOR flash nonvolatile memory cell requires 5.0 V drain-to-source (Vds=5.0 V) to enable a high current CHE injection program. Alternately, a NAND flash nonvolatile memory cell requires Vds=0 V between the drain and the source for a low current Fowler-Nordheim channel tunneling program process. As a result, one NAND flash cell occupies only one half area of a one NOR flash cell. This permits a NAND flash nonvolatile memory device to be used in low cost applications that require huge data storage, while the NOR flash device is extensively used as a program-code storage memory which requires less data storage but faster random access speed now.

However, there is still a need to improve the speed of the slow NAND flash in the market place. For example, the current consumer portable applications require a high speed, high density, and low cost nonvolatile memory solution. The "Open NAND Flash Interface Specification", Revision 2.3, Aug. 25, 2010, by the Open NAND Flash Interface working group (ONFI) defines a standardized NAND flash device interface and protocol for providing the way for a system to be designed to support a range of NAND flash devices without direct design pre-association. The ONFI interface provides support for a range of device capabilities and future development of NAND nonvolatile memory devices.

The ONFI interface supports asynchronous and synchronous operations and the ONFI working group has proposed many powerful functions such as "EZ NAND". The "EZ NAND" includes the control logic packaged together with NAND to perform the NAND management functionality that is lithography specific (e.g. ECC), while retaining the NAND protocol infrastructure. The ONFI interface does not consider memory structures that combine NAND memory arrays with NOR memory arrays on a single substrate. Further, ONFI interface is not proposed to be used for fast random and extremely high density NOR usage either.

The ONFI NAND interface definition has two options including x8 and x16 I/O pins for respective byte and word data access with full compatibility in pin definition and pin number. Besides newly proposed ONFI NAND, several popular NAND-like flash memories are also available in the market places. For example, the conventional NAND flash with its own 48 pin definition has been extensively used in the market place for more than a decade. The regular NAND has both x8 and x16 I/O pin options.

Another popular flash is SLC OneNAND which was introduced by Samsung for years. The highest density of OneNAND was 8 Gb in 2010 with additional 16 address pins of A0-A15 on a 48 pin NAND-like package. The OneNAND made of NAND flash along with several fast cache memories on a same die is used as a pseudo NOR solution with 48 pins as the regular NAND flash. OneNAND has the advantage over the traditional NOR flash when density gets higher than 2 Gb. However, the 16 only independent address pins confine the full random access space to a page, rather than a byte or a word. As a consequence, OneNAND is a pseudo NOR with random page access, rather than random byte or random word access NVM memory. It is also desirable to improve the speed of operation for the OneNAND flash memory.

SUMMARY OF THE INVENTION

The present invention has been made to meet the need of improving the speed of memory operations in various VM and NVM mentioned above. Several novel preferred sets of universal timing waveforms, control flows and schemes are provided for significantly increasing the speed of random read and write operations of DRAM and pSRAM, and the speed of random read operations of ROM, EPROM, EEPROM, NOR flash and NAND flash.

According to the invention, the preferred sets of timing waveforms, command files and pin assignment are designed based on the appropriate pins of the existing popular NAND flash packages compatible with JEDEC or ONFI. Most of pin definition, assignment and count or other special pin assignment is compatible with the same package widely accepted in the industry. The changes in timing waveforms and control sequence of the present invention are carefully designed to be fully compatible with the existing popular packages that have fixed pin count, pin definition, and read and write waveforms to avoid costly development due to software incompatibility.

In the past, the speed and density improvements of all VM and NVM memories rely heavily on the migration of advanced but costly technology nodes and more sophisticated circuit schemes. In contrast, the present invention discloses a novel approach, which simply changes the whole set of read and write timing waveforms and command file definition to achieve the dramatic and reliable improvements over the existing random read and write operations of VM and NVM memories without costly and time consuming process and design efforts.

Accordingly, the present invention provides an enabling technology for improving the memory access speed by pre-latching the next random accessed memory address on chip before the memory data of the currently accessed memory address are outputted at I/O pins in contrast to the state-of-the-art memory technology in which only the currently accessed memory address is latched before the currently accessed memory data appear ready at the I/O pins.

The present invention further adds a set of extra new commands, new pin assignment, new pin functions, and new control sequences on top of the already used pins or unused pins of the existing memory package to meet the requirements for improving the random read and write operations with the spirit of keeping the total number of defined pins for the memory package unchanged so that the popularly accepted IC board design requires no costly change and the hurdle of market acceptance can be removed.

An object of the present invention is to provide a new set of preferred timing waveforms, control sequences and pin assignment for parallel NOR flash encapsulated in a regular NOR package to improve the performance of random read and write operations including asynchronous mode, synchronous mode or word burst read operations. The key idea is to pre-latch the next accessed address on chip before reading out or writing in the memory data of the currently accessed address to eliminate the delays of input buffers and output buffers that need to drive the big output capacitor loading.

Another object of the present invention is to provide a new set of preferred timing waveforms, control sequences and pin assignment for parallel pSRAM to improve the random access speed in an asynchronous mode, synchronous mode or word burst read operation. Similarly, the next accessed address on chip is pre-latched before reading out or writing in the memory data of the currently accessed address to eliminate the delays of input buffers and output buffers that need to drive the big output capacitor loading.

It is also an object of the invention to provide a novel set of preferred timing waveforms and control sequences for the parallel NOR flash integrated with NAND flash on a same IC die and encapsulated in a 48 pin ONFI NAND package, which typically has either zero or insufficient number of address pins, to improve the performance of read and write operations.

According to the present invention, the NOR flash on the 48 pin ONFI NAND package is provided with x8, x16 and x32 I/O pin options but no address pins in which commands from an external control device may interrupt any on-going process to restart a single-clock fast random read operation at any location within the entire nonvolatile memory space.

It is a further object of the present invention to provide the NOR flash on the 48 pin ONFI NAND package with commands that define clearly how many clock cycles are required to input multiple 16 bit address data into the on-chip address stack through 16 I/O pins of the 48 pin ONFI package. The number of clocks required depends on the maximum addressable memory space of the NOR flash. When 16, 32 or 48 bit address data are latched in one, two or three clock cycles, the NOR flash is provided with fast random access memory space up to $2^{16}$, $2^{32}$ or $2^{48}$ addresses respectively. After the defined spec of tACC time, the 16 bit data of the first accessed word from any location of the entire NOR flash of up to $2^{48}$ address space are ready at the 16 I/O pins.

It is yet another object of the invention to provide a novel set of preferred timing waveforms and control sequences for the parallel NOR flash integrated with NAND flash on a same IC die and encapsulated in a regular 48 pin non-ONFI NAND package, which typically has either zero or insufficient number of address pins, to improve the performance of read and write operations.

A further object of the present invention is to provide the parallel NOR flash with x8 I/Os on an existing 48 pin NAND package with a novel set of preferred waveforms and bi-directional I/O pins so that the number of the accessed data in one cycle read and write operations can be flexibly expandable to x16 I/Os for 16 bit CPU usage. The pin assignment is made compatible with the existing 48 pin assignment for either ONFI NAND or regular NAND pin definition.

It is still a further object of the present invention is to provide the parallel NOR flash with 16 I/Os on an existing 48 pin NAND package with a novel set of preferred waveforms and bi-directional I/O pins so that the number of the accessed data in one cycle read and write operations can be flexibly expandable to x32 I/Os for 32 bit CPU usage. The pin assignment is made compatible with the existing 48 pin assignment for either ONFI NAND or regular NAND pin definition.

Another object of the present invention is to sequentially input a $2^{nd}$ memory address of up to 48 bits into the NOR flash encapsulated in a 48 pin regular NAND package in three sequential clocks with 16 bit address data per clock during the first interval of tACC time in a regular read operation. The second 48 bit memory address of the next immediately accessed address has to be clocked in and latched within the time period of the first tACC with safe margin before the first 16 bit valid memory data are ready at 16 I/O pins. As a result, the fast random access of the second word of the entire $2^{48}$ NOR memory space can be made possible.

A further object of the present invention is to provide a command table that adds several new preferred NOR flash command sets into existing NAND flash command sets to allow the concurrent or non-concurrent read and write operations of NOR flash and NAND flash on a same IC die encapsulated in a 48 pin NAND package. The pin assignment is made compatible with the existing 48 pin assignment for either ONFI NAND or regular NAND pin definition.

It is also a further object of the present invention to provide a new set of preferred timing waveforms, control sequences and pin assignment for serial SQI NOR flash encapsulated in an 8 pin package for improving the performance of random read and write operations. Similarly, the next accessed address on chip is pre-latched before reading out or writing in the memory data of the currently accessed address to eliminate the delays of input buffers and output buffers that need to drive the big output capacitor loading.

It is still another object of this invention to provide a novel set of preferred timing waveforms and control sequences designed for the existing NAND flash memories without changing their most popular acceptable pin assignment and functions so that their random read and write performance can be greatly improved over the traditional ones. The NAND flash memories of this invention include regular NAND, DDR NAND and OneNAND.

The present invention provides a novel page read operation for DDR NAND or toggle NAND flash encapsulated in a 48 pin package. When the data of multiple random pages are read, the address of the next accessed page on chip is pre-latched before reading out or writing in the memory data of the currently accessed page to eliminate the delays of input buffers and output buffers that need to drive the big output capacitor loading.

The present invention will be apparent to those skilled in the art by reading the following description, with reference to the attached drawings brief summarized below.

BRIEF DESCRIPTION OF THE DRAWINGS

FIG. 2 shows a top view of the pin assignment of a BGA package and the details of pin names for both the parallel NOR flash and the pSRAM in the MCP combo memory shown in FIG. 1.

FIG. 13 shows a top view of the pin assignment of an FBGA package and the details of pin names for both the serial NAND flash and the parallel DRAM of the MCP combo memory shown in FIG. 12.

FIG. 19 shows a table that contains the details of pin assignment, pin definitions, command codes and key functions of read, erase and several types of program operations of the traditional ONFI NAND package.

FIG. 20 shows a table that adds several new commands and operations of the present invention for the combo flash memory that adds the NOR flash into the 48 pin ONFI NAND package.

DETAILED DESCRIPTION OF THE INVENTION

Figure 1:
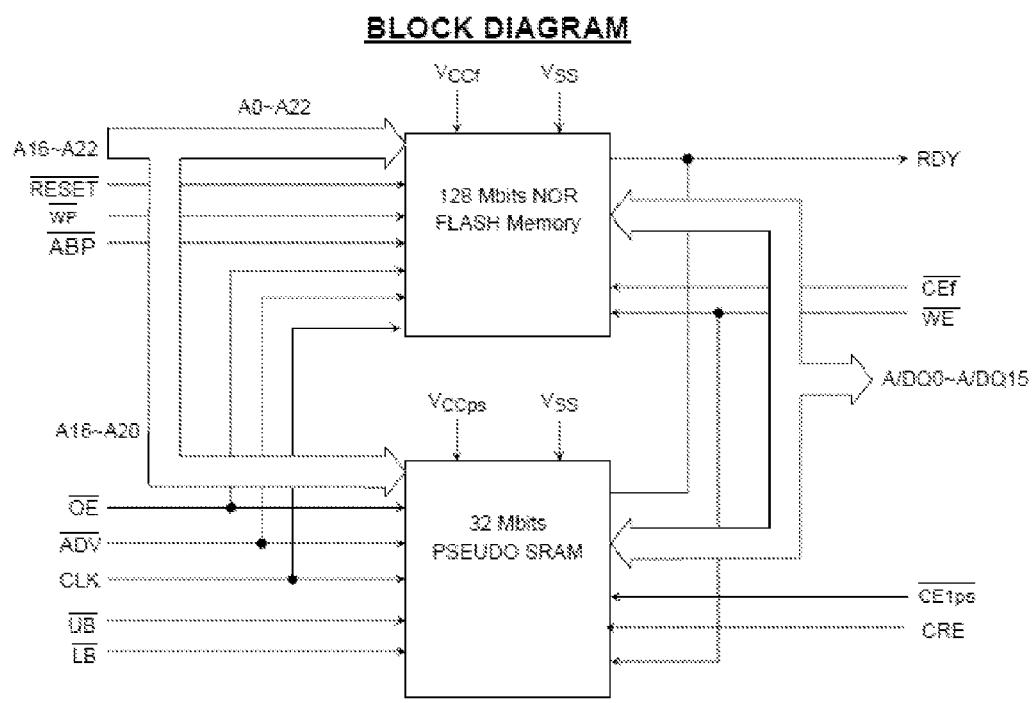
FIG. 1 shows a circuit block diagram of an MCP combo memory with 128 Mb NOR flash and 32 Mb pSRAM.

FIG. 1 shows a circuit block diagram of an MCP combo memory with a parallel NOR flash memory and a parallel pSRAM for today's middle-end mobile phone applications. The MCP combo memory comprises a NOR chip and a pSRAM chip. Both memory chips share the common external pins that include seven uni-directional address pins A16-A22 and sixteen bi-directional pins A/DQ0-A/DQ15, and other control pins such as RDY, CEf WE, CE1ps, CRE, UB, LB, CLK, ADV, OE, ABP, WP and RESET.

FIG. 2 shows the pin assignment of the MCP combo memory in FIG. 1 for less than 128 Mb parallel NOR flash and less than 32 Mb parallel pSRAM. The upper table shows the pin assignment of the BGA package of the MCP combo memory and the lower table shows the details of pin names and functions for the NOR flash and the pSRAM. There are two groups of address pins. One group comprises the seven uni-directional address pins A16-A22 shared by both the pSRAM and the NOR flash. The other group comprises the sixteen bi-directional pins A/DQ0-A/DQ15. These sixteen bi-directional pins have two functions during read and write operations. One function serves as the 16 address input pins A0-A15, and the other function serves as the 16 data-input and data-output pins DQ0-DQ15.

The total number of address pins A0-A22 for both the NOR flash and the pSRAM is 23 and each addressed data have 16 bits. Therefore, the total addressable memory space is $2^{23} \times 16$ bits. In addition to the address and data pins, there are two separate chip-enable pins CE1ps for the pSRAM and CEf for the NOR flash as well as a common clock pin CLK, write enable input pin WE, output enable input OE, address valid input pin ADV, ready/busy output pin RDY and ground pin Vss. The two memories have separate power supplied by the same power source Vcc. Vccf is for the power supply of the NOR flash, while the Vccps is for the power supply of the pSRAM. Furthermore, there are dedicated pins such as write protection pin WP and hardware-reset input pin RESET for the NOR flash only.

Figure 3:
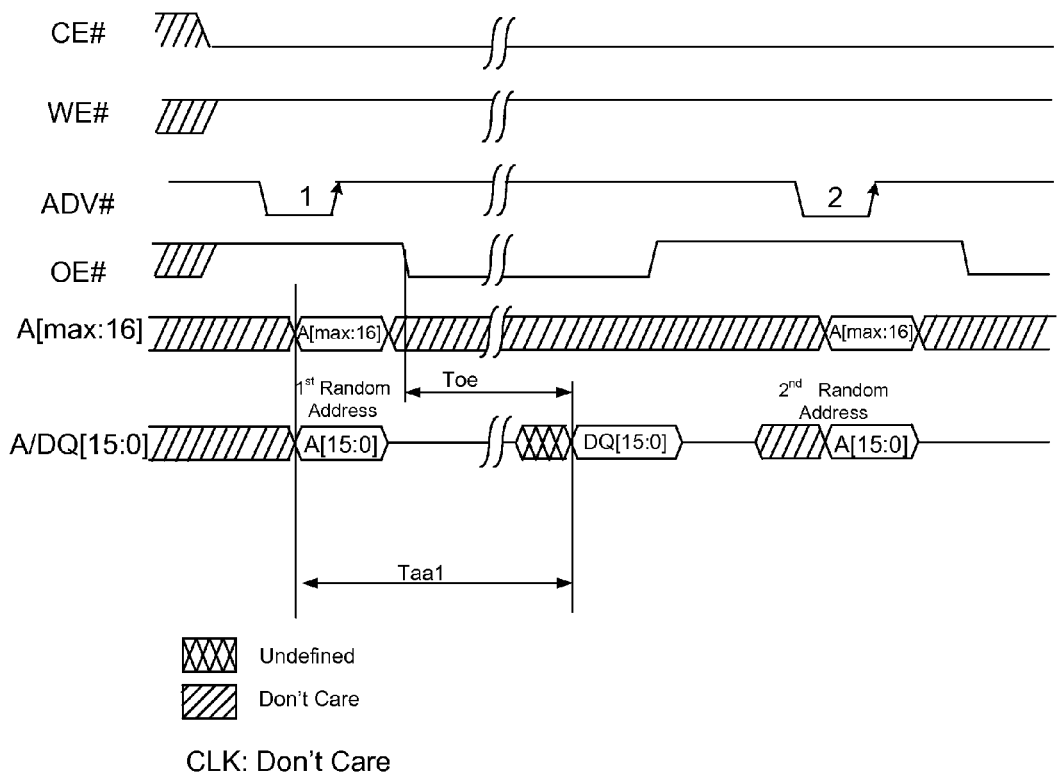
FIG. 3 shows a set of timing waveforms of an asynchronous read mode operation of the parallel NOR flash in the MCP combo memory of FIG. 1.

FIG. 3 shows a set of detailed timing waveforms of the asynchronous mode read operation of the NOR flash of the MCP combo memory. The waveforms show the conventional random read timing control sequence of addressing the NOR flash with 16 bi-directional pins A/DQ0-15 and uni-directional address pins Amax-A16 along with other control signals ACE#, OE#, WE#, ADV# and RDY.

The waveforms shown are similar to the regular NOR flash being set in an asynchronous mode read operation that has three key related specs $t_{OE}$, $t_{CE}$ and $t_{ACC}$. The memory address to be accessed has to be latched first in one cycle. This is done by applying the valid address data on the bus of Amax-A16 and A/DQ0-A/DQ15 simultaneously upon the rising edge of ADV# with an address setup time $t_{AAVDS}$ when CE# and OE# are set to low and WE# and RDY are set to high. After $t_{OE}$, $t_{CE}$ and $t_{ACC}$ time, the valid accessed 16-bit data appear at the 16 pins A/DQ0-A/DQ15.

For the write operation of the NOR flash, WE# is set to low. When OE# is set to low, the 16 data output is enabled on the bus of A/DQ15-A/DQ0 from a tri-state mode when AVD# swings from low to high. When CE# or OE# is set to high, the 16 I/O pins A/DQ15-A/DQ0 enter the tri-state mode regardless of the levels of WE# and RDY signals.

Figure 4:
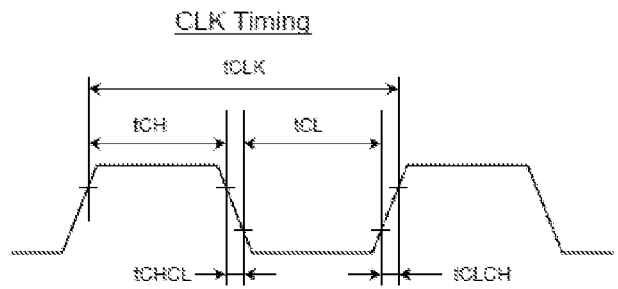
FIG. 4 shows the clock timing definition of one single clock tCLK of the parallel NOR flash in the MCP combo memory of FIG. 1.
Figure 5:
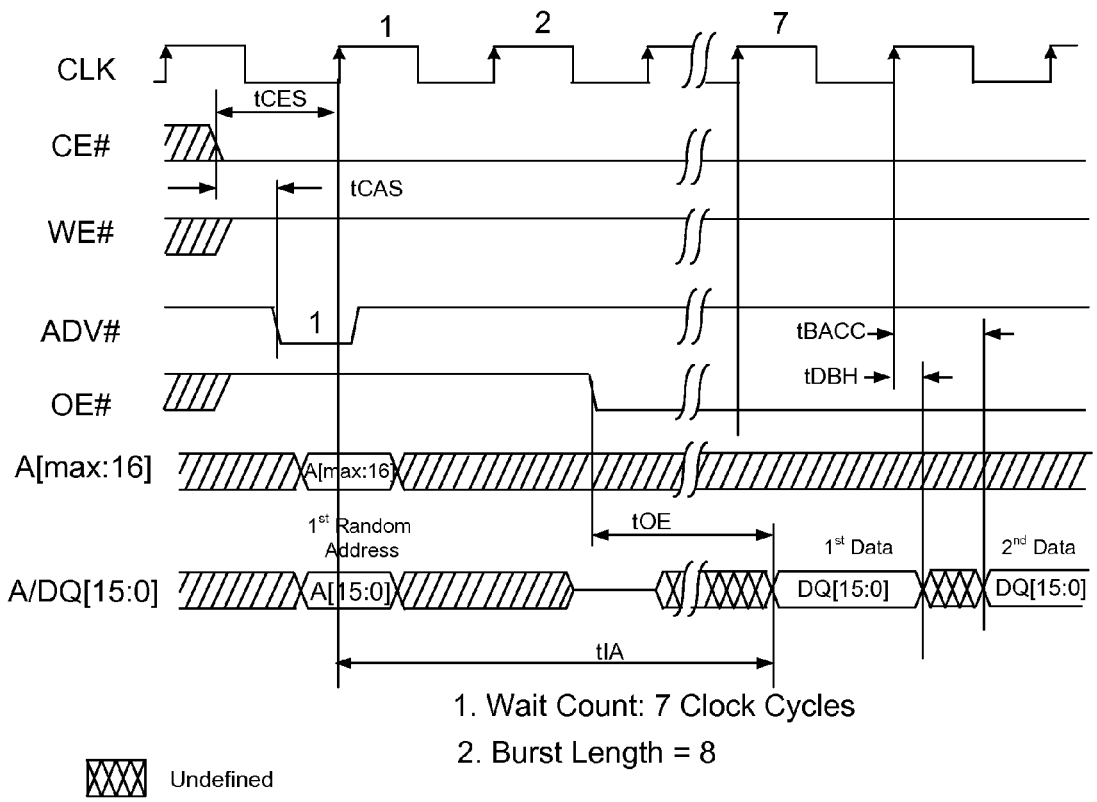
FIG. 5 shows a set of timing waveforms of the control sequence in a synchronous read mode operation of the parallel NOR flash in the MCP combo memory of FIG. 1.

FIG. 4 and FIG. 5 show a set of waveforms of the clock timing and the synchronous mode read operation of the NOR flash of the MCP combo memory. In FIG. 4, the definition of clock timing CLK of one single clock tCLK is shown. The one whole cycle tCLK is equally divided into two periods tCH and tCL with the rising time spec tCLCH and the falling time spec tCHCL.

A key difference between the asynchronous read operation shown in FIG. 3 and the synchronous read operation shown in FIG. 5 is in the clock timing CLK pin of FIG. 5. In contrast to FIG. 3, every operation of $t_{OE}$ and $t_{ACC}$ in FIG. 5 is set to be synchronous with the rising edge of CLK timing signal when CE#, OE# and RDY are set to low.

The waveforms shown in FIG. 5 are similar to the regular NOR flash being set in a synchronous mode read operation that has two key related specs $t_{OE}$ and $t_{RACC}$. The memory address to be accessed has to be latched first. This is done by applying the valid address data on the bus of Amax-A16 and A/DQ0-A/DQ15 simultaneously upon the rising edge of the first CLK signal when ADV# is set to low with the address setup time $t_{ACS}$ and the hold time $t_{ACH}$.

When RDY, CE# and OE# are set to low, the rising edge of the 7th CLK signal will clock out the 16 valid data output of the current address on the bus of A/DQ15-A/DQ0 after the time delay of $t_{RACC}$. When CE# or OE# is set to high, the 16 I/O pins A/DQ15-A/DQ0 enter the tri-state mode regardless of the levels of WE# and RDY signals.

Figure 6:
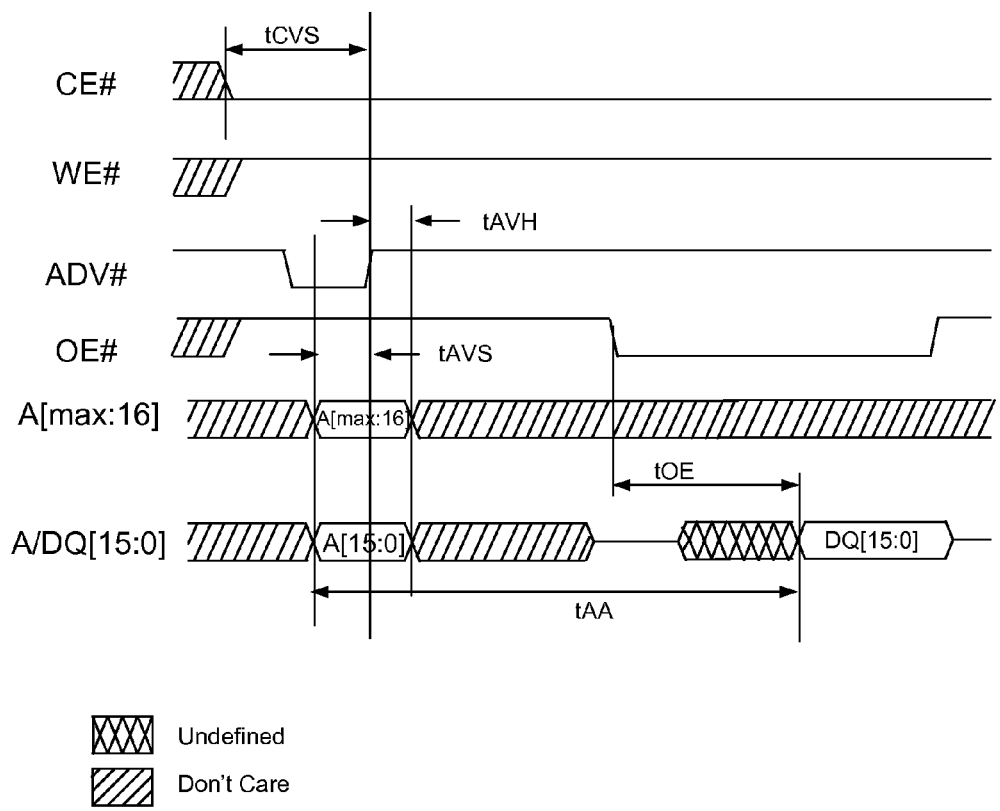
FIG. 6 shows a set of timing waveforms of the control sequence of an asynchronous read mode operation of the pSRAM in the MCP combo memory of FIG. 1.

FIG. 6 shows a set of timing waveforms of the control sequence that defines the asynchronous read operation of a conventional pSRAM memory with 16 bi-directional pins A/DQ[15:0] and additional uni-directional address pins A[max:16], and other control pins CE#, ADV#, OE#, WAIT, WE# and LB#/UB# as described in previous paragraphs.

The waveforms show how to access the data of pSRAM from any given random address and several key speed related parameters $t_{OE}$, $t_{AA}$ and $t_{CO}$. Although pSRAM has a design similar to a regular DRAM, it does not have external CAS and RAS pins as defined in the regular DRAM.

All memory address bits to be accessed have to be latched first in one cycle. This is done by applying the valid address data on the bus of A[max:16] and A/DQ[15:0] simultaneously upon the rising edge of ADV# with the address setup time $t_{AVS}$ when CE# and LB#/UB# are set to low but WE# is set to high. After $t_{OE}$, $t_{CO}$ and $t_{AA}$ time, the valid accessed 16-bit data appear at the 16 I/O pins A/DQ[15:0].

For the write operation of the pSRAM, WE# is set to low. When OE# is set to low, the 16 data output is enabled on the bus of A/DQ[15:0] from a tri-state mode when AVD# swings from low to high. When CE# or OE# is set to high, the 16 I/O pins A/DQ[15:0] enter the tri-state mode regardless of the levels of WE# and WAIT signals.

Figure 7:
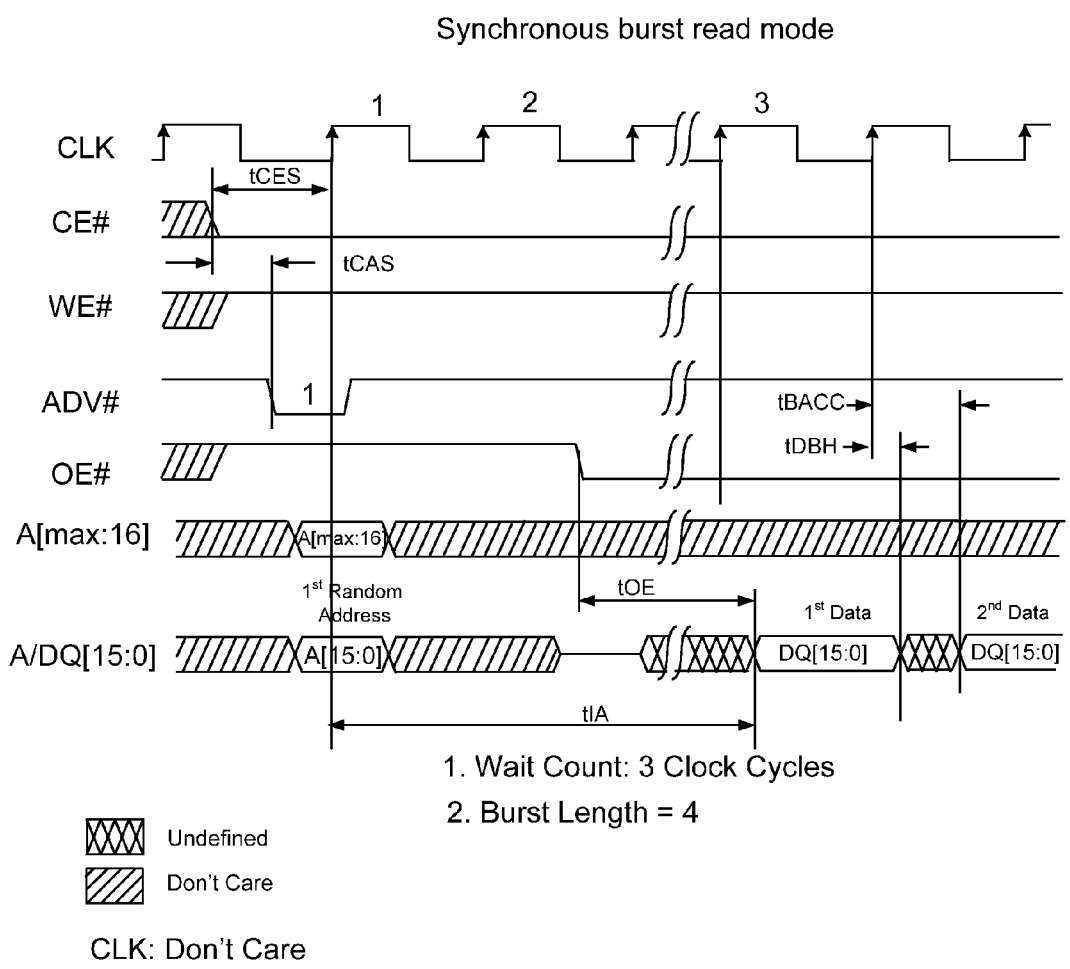
FIG. 7 shows a set of timing waveforms of the control sequence of a synchronous word burst read operation of the pSRAM in the MCP combo memory of FIG. 1.

FIG. 7 shows a set of timing waveforms of the control sequence that defines the synchronous word burst read operation of a conventional pSRAM with 16 bi-directional pins A/DQ[15:0], additional uni-directional address pins A[max:16], other control pins CE#, ADV#, OE#, WAIT, WE# and LB#/UB# and one clock pin CLK.

The waveforms show how to access the data of pSRAM from any given random address and several key speed related parameters $t_{OE}$, $t_{AA}$ and $t_{CO}$. All memory address bits to be accessed have to be latched first in one cycle. This is done by applying the valid address data on the bus of A[max:16] and A/DQ[15:0] simultaneously upon the rising edge of CLK when ADV# is set to low with the address setup time of tAVS when CE# is set to low but OE# is set to high and LB#/UB# are set to low but WE# is set to high. After $t_{OE}$, $t_{CO}$ and $t_{AA}$ time, the valid accessed 16-bit data appear at the 16 I/O pins A/DQ[15:0].

For the write operation of the pSRAM, WE# is set to low. When OE# is set to low, the 16 data outputs are enabled on the bus A/DQ[15:0] from a tri-state mode when AVD# swings from low to high. When CE# or OE# is set to high, the 16 I/O pins A/DQ[15:0] enter the tri-state mode regardless of the levels of WE# and WAIT signals.

In summary, FIG. 1 through FIG. 7 show a common approach to addressing the accessed data though 16 I/O pins A/DQ[15:0]. All currently accessed 16 data bits are either asynchronously or synchronously outputted after the current memory address bits are latched first. As a result, the speed of each random access read operation is slowed down because the time delays of input and output buffers and the capacitor charge and discharge time cannot be avoided.

Figure 8:
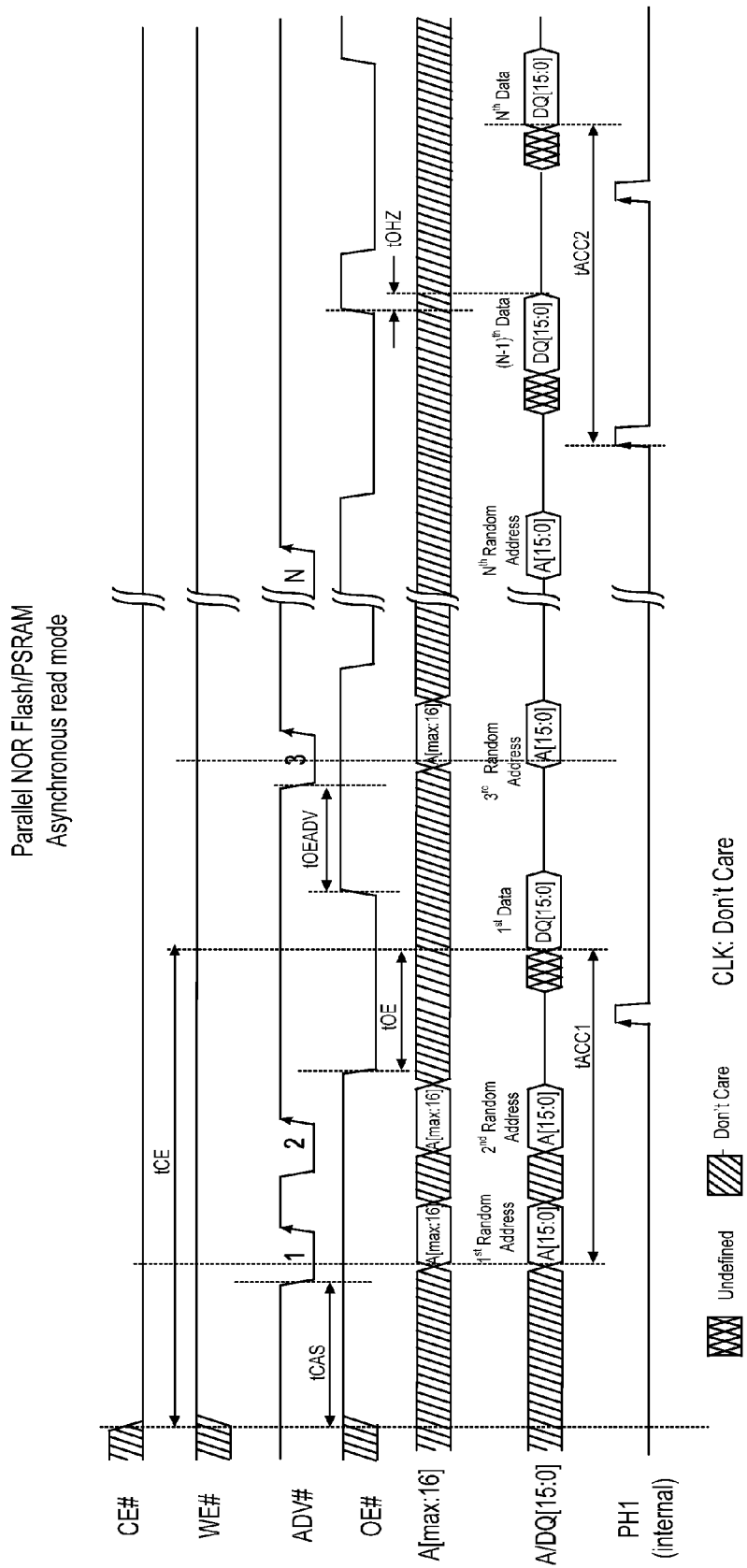
FIG. 8 shows a novel set of timing waveforms of the preferred control sequence of an asynchronous read mode operation for the parallel NOR or pSRAM of a MCP combo memory according to the present invention.

FIG. 8 shows a novel set of preferred timing waveforms of an asynchronous read operation for both parallel NOR flash and parallel pSRAM of the MCP combo memory of the present invention. The waveforms show how to address the accessed NOR flash through the 16 bi-directional pins A/DQ [15:0] and A[max:16] along with other control signal pins CE#, WE#, ADV# OE# and PH1. PH1 is generated internally on-chip for a reliable asynchronous control flow of the input and output of the accessed data.

As described above, only the current memory address to be accessed is latched before the output of the currently addressed data in the memory operations of the conventional NOR flash or pSRAM. In the present invention, every next memory address is latched right before the output of the currently addressed data.

The address bits to be accessed have to be latched first in one cycle. This is done by applying the valid address data on the bus of A[max:16] and A/DQ[15:0] simultaneously upon the rising edge of ADV# when CE# is set to low but OE# and WE# are set to high. As shown in the waveforms, before the $1^{st}$ accessed 16-bit data corresponding to the $1^{st}$ random address are outputted, the next ($2^{nd}$) random address is latched first. After tOE, tCE and tACC1 time, the valid $1^{st}$ accessed 16-bit data appear at the 16 pins A/DQ[15:0]. As a result, the delays of input buffers and output buffers due to loading of a large capacitor are eliminated, and the speed of the random read operation is significantly improved over the conventional memories.

Similarly, after the $1^{st}$ accessed data are outputted, the next (3rd) random address is latched first before the $2^{nd}$ accessed data are outputted after tACC2. In other words, the (n+1)th address is latched before the nth accessed data are outputted to the 16 I/O pins.

Figure 9:
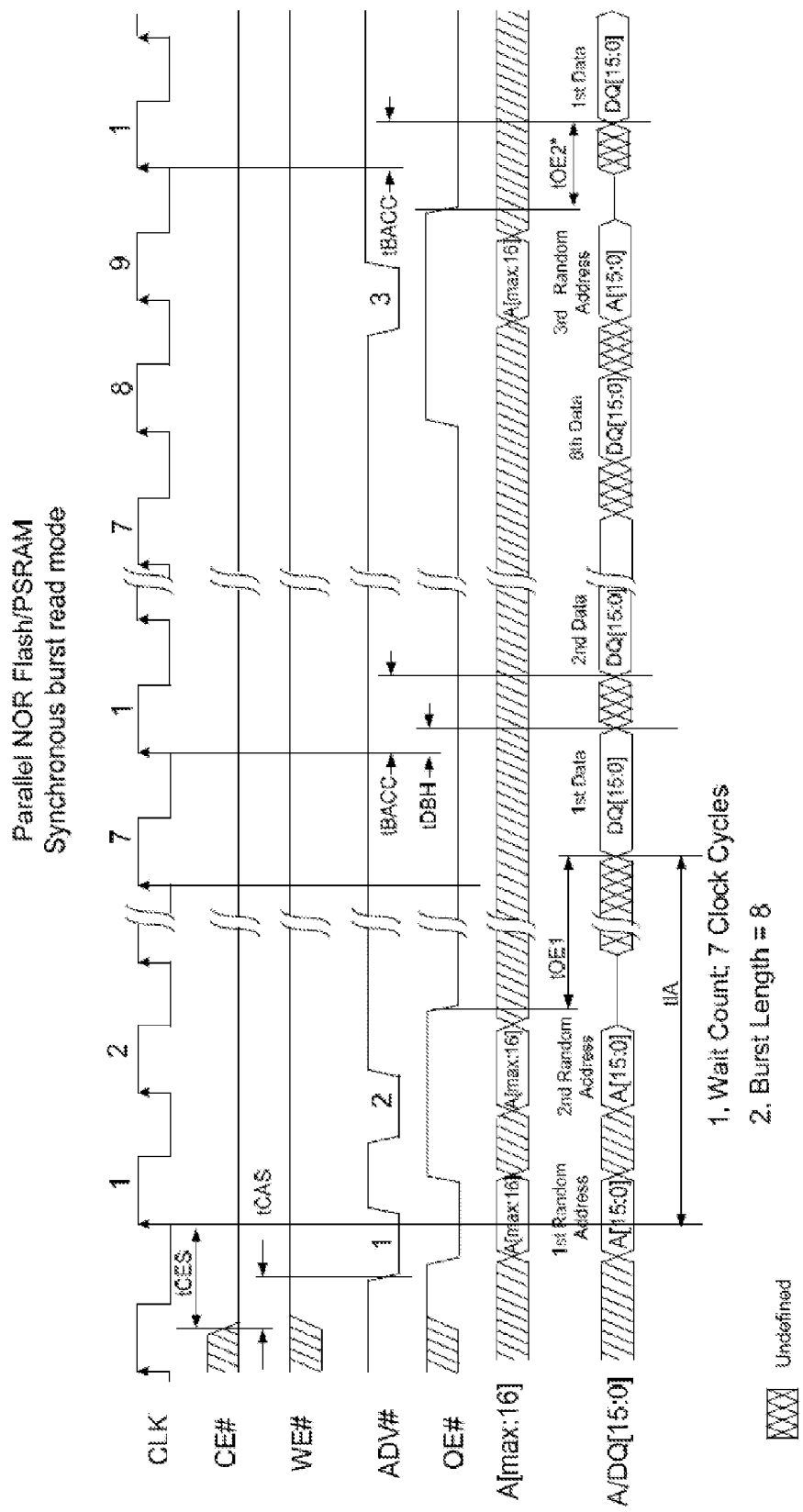
FIG. 9 shows a novel set of timing waveforms of the preferred control sequence of a synchronous read mode operation for the parallel NOR or pSRAM of the MCP combo memory according to the present invention.

FIG. 9 shows a novel set of preferred timing waveforms of a synchronous read operation for both parallel NOR flash and parallel pSRAM of the MCP combo memory of the present invention. The waveforms show how to address the accessed NOR flash through the bi-directional pins A/DQ[15:0] and A[max:16] along with other control signal pins CE#, WE#, ADV# OE# and CLK. CLK is controlled by the host CPU for a reliable synchronous control flow of the input and output of the accessed data.

Similar to the asynchronous read, every next address is latched right before the output of the currently accessed data in the present invention. The address bits to be accessed have to be latched first in one cycle. This is done by applying the valid address data on the bus of A[max:16] and A/DQ[15:0] simultaneously upon the rising edge of ADV# when CE# is set to low but OE# and WE# are set to high. As shown in the waveforms, before the $1^{st}$ accessed 16-bit data corresponding to the $1^{st}$ address are outputted, the next ($2^{nd}$) address is latched first. As a result, the delays of input buffers and output buffers due to loading of a large capacitor are eliminated, and the speed of the random read operation is significantly improved over the prior art.

Figure 10:
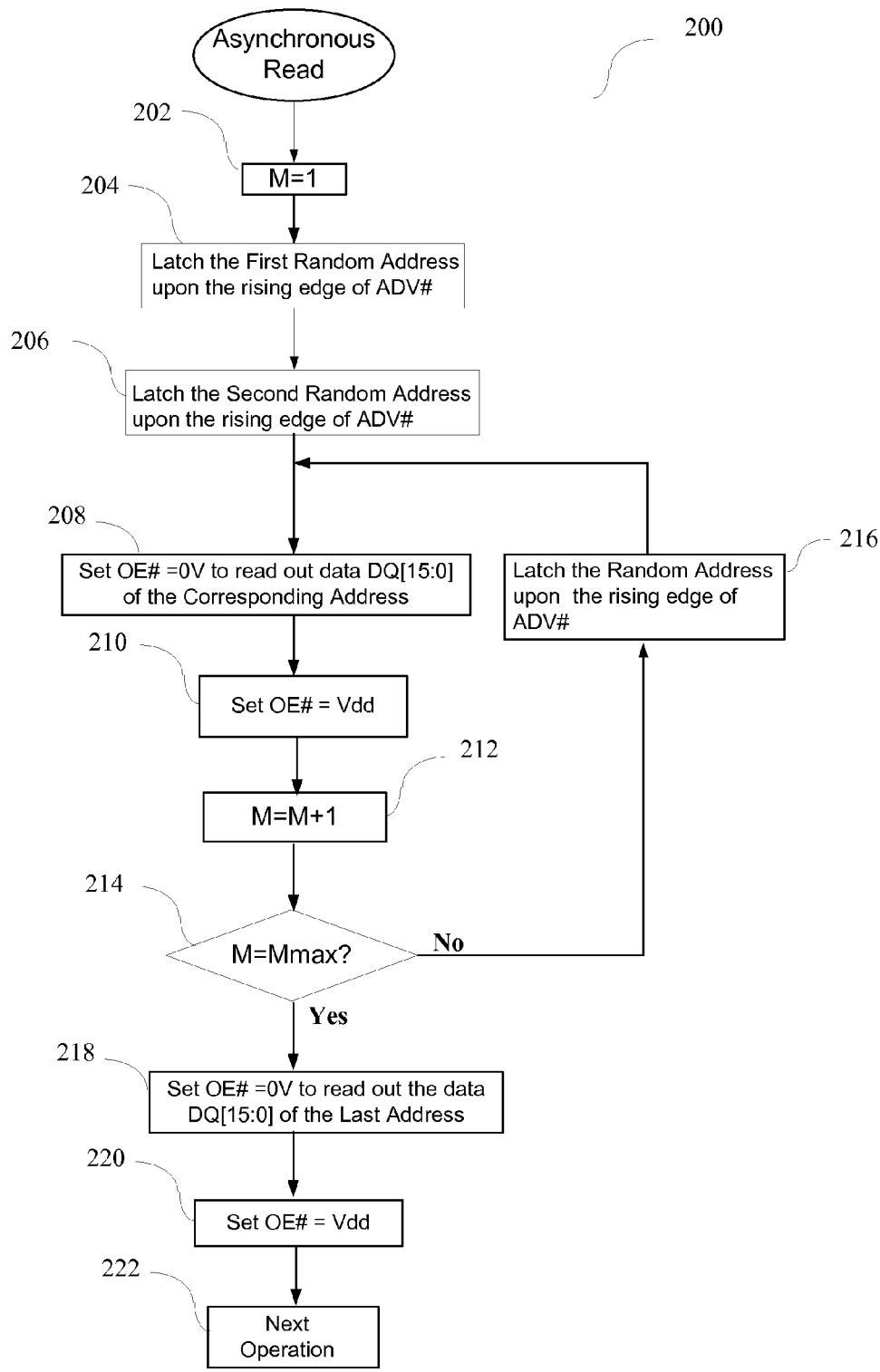
FIG. 10 shows the method and flow of the corresponding control sequence and timing waveforms of FIG. 8 for the parallel NOR or pSRAM of the MCP combo memory according to the present invention.

FIG. 10 shows the novel method and flow 200 of the corresponding control sequence and timing waveforms illustrated in FIG. 8 for both parallel NOR flash and parallel pSRAM of the present invention. The flow defines the preferred steps of the asynchronous mode read operation for the two independent parallel NOR flash and parallel pSRAM memories according to the present invention.

The method 200 of the present invention starts from an asynchronous read command. In step 202, a counter M is reset to 1. The counter M is set to store the address number of the currently accessed memory data that are to be read out. Before the currently accessed memory data are outputted, the memory address has to be latched. In a conventional asynchronous read operation, only the current address is latched before the currently addressed data appear ready at the I/O pins. But in the novel approach of the present invention, the next address to be accessed is preferably latched before each currently addressed data are outputted.

In step 204, the max+1 bit wide address of the first random address of the NOR flash or pSRAM is latched upon the first rising edge of the ADV# signal through the address pins A[max:16] and A/DQ[15:0] simultaneously with sufficient address setup time. Because the asynchronously random read time is usually more than 70 ns at 1 G bit level, there is a long delay to allow the next accessed address to be latched immediately through the same address pins upon the second rising edge of ADV# as shown in step 206.

It should be noted that only the first latched 16 address bits of the first random address are coupled to the row and column decoders of the MCP combo memory. The second latched 16 address bits of the second random address are in 16 stack registers waiting to be coupled to the decoders after the memory data of the first random address are sent to the output buffers in accordance with the present invention.

In step 208, there are two addresses already latched and the 16-bit data of the first latched address are sent to the 16 I/O buffers. The OE# signal is set to low. Upon the falling edge of the OE# signal, the output buffers exit from a tri-state to allow the reading of the data of the first latched address available at the I/O pins. Because there is about 30 pf capacitor loading, the I/O data start to be charged up or discharged depending on whether the accessed data is "1" or "0".

According to the present invention, the appropriate time to turn on the output buffers is to wait long enough to allow the read delays, including the delays of the propagation stages of decoders, the charge-up of the word lines and bit lines, and the development of small cell signals in the sense amplifiers, before turning on the output buffers. The second latched address should be shifted to the selected decoder in synchronization with the sending of the currently accessed data to the output buffers so that the next addressed data are available for reading.

Once the data of the first latched address are outputted to the I/O pins and latched by the host CPU, OE# is switched back from low to high in step 210 to allow the next address to be inputted and latched on stack registers again. In step 212, the counter is incremented by one. The incremented counter is checked in step 214. If the last accessed address is not reached in step 214, the method latches the next address on the rising edge of ADV# as shown in step 216 before the currently accessed data are outputted in step 208.

If the address to be accessed is the last one, i.e., M equals to the address number Mmax of the last memory address to be accessed in step 214, the signal CE# is switched back to low in step 218 to read out the data of the last accessed address. Therefore, two 16-bit data are outputted for the last two random addresses at the end of the memory command. In step 220, the signal CE# is set to high to put all 16 output buffers in the tri-sate ready for the next memory command in step 222.

Figure 11:
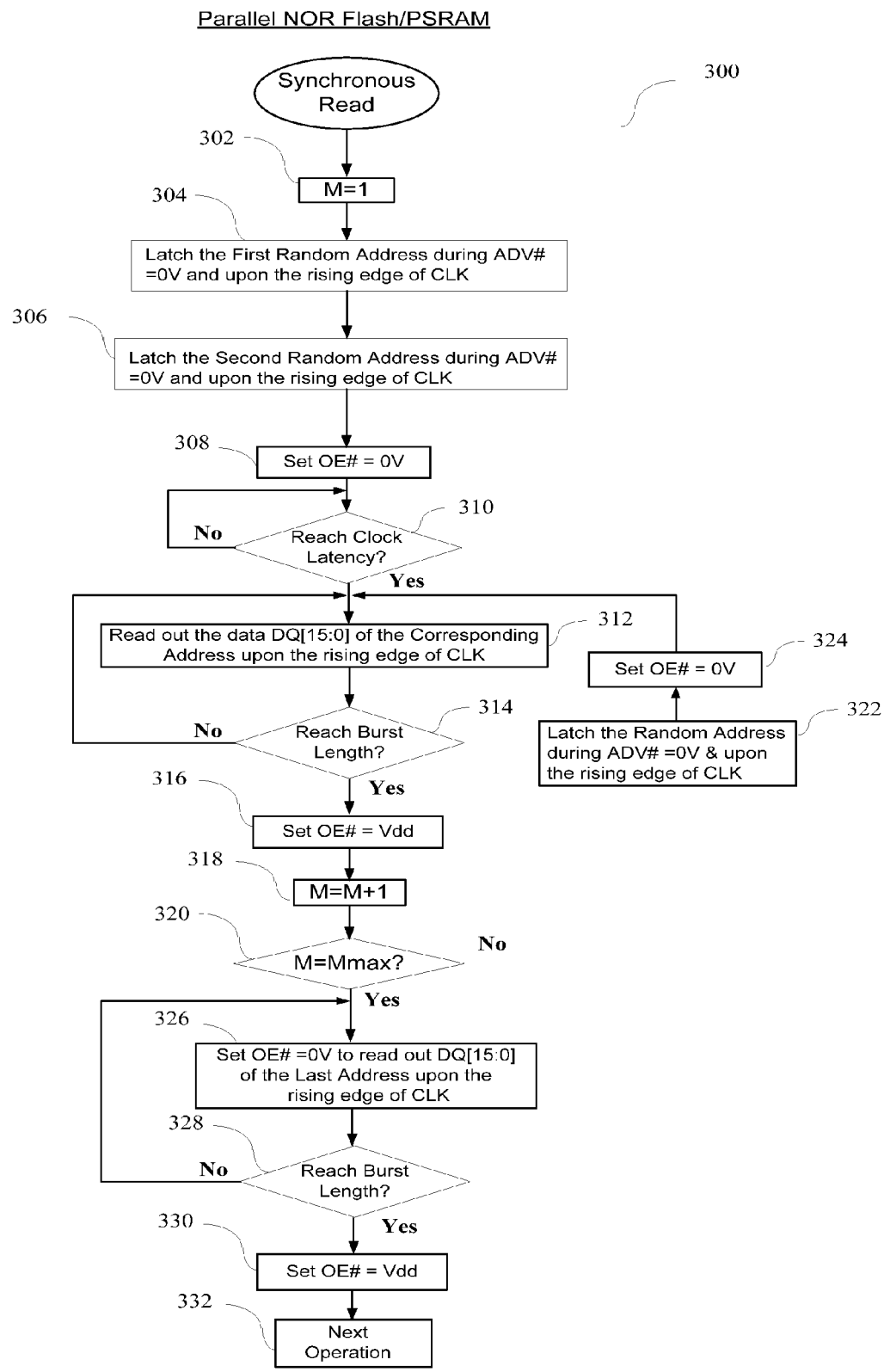
FIG. 11 shows the method and flow of the corresponding control sequence and timing waveforms of FIG. 9 for the parallel NOR or parallel pSRAM of the MCP combo memory according to the present invention.

FIG. 11 shows the method and flow 300 of the corresponding control sequence and timing waveforms illustrated in FIG. 9 for both parallel NOR flash and parallel pSRAM of the present invention. The flow defines the preferred steps of the synchronous read mode operation for the two independent parallel NOR flash and parallel pSRAM memories according to the present invention.

The method 300 of the present invention starts from a synchronous read command. In step 302, a counter M is reset to 1. The counter M is set to store the address number of the currently accessed memory data that are to be read out. Before the currently accessed memory data are outputted, the memory address has to be latched. In a conventional synchronous read operation, only the current address is latched before the currently addressed data appear ready at the I/O pins. But in the novel approach of the present invention, the next address to be accessed is preferably latched before each currently accessed data are outputted.

In step 304, the max+1 bit wide address of the first random address of the NOR flash or pSRAM is latched upon the first rising edge of signal CLK through the address pins A[max: 16] and A/DQ[15:0] simultaneously with sufficient address setup time when the ADV# signal is set to low. Because the synchronously random read time is usually more than 70 ns at 1 G bit level, there is a long delay to allow the next accessed address to be latched immediately through the same address pins upon the second rising edge of CLK when ADV# is set to low as shown in step 306.

Only the first latched 16 address bits of the first random address are coupled to the row and column decoders of the MCP combo memory. The second latched 16 address bits of the second random address are in 16 stack registers waiting to be coupled to the decoders after the 16-bit data of the first random address are sent to the output buffers in accordance with the present invention. In step 308, OE# signal is set to low. Upon the falling edge of the OE# signal, the output buffers exit from a tri-state to allow the reading of the data of the first latched address available at the I/O pins after a set clock latency as shown in step 310. Because there is about 30 pf capacitor loading, the I/O data start to be charged up or discharged depending on whether the accessed data is "1" or "0".

According to the present invention, the appropriate time to turn on the output buffers is to wait long enough to allow the read delays, including the delays of the propagation stages of decoders, the charge-up of the word lines and bit lines, and the development of small cell signals in the sense amplifiers, before turning on the output buffers. The second latched address should be shifted to the selected decoder in synchronization with the sending of the currently addressed data to the output buffers so that the next addressed data are available for reading.

Once the data of the 1$^{st}$ latched address data are outputted at the I/O pins and latched by the host CPU upon the rising edge of CLK in step 312, the length of the burst read is checked against the length of latched burst data in step 314. If the length of the burst read has not been reached, the flow returns to step 312 to output the burst data again. A length counter is incremented and the accessed 16-bit data are synchronously sent to output buffers upon each rising edge of CLK in step 312 with OE# being set to low.

When the length of the burst read is reached in step 314, OE# is switched back from low to high in step 316 to allow the next address to be inputted and latched on stack registers again. In step 318, the counter is incremented by one. The incremented counter is checked in step 320. If the last accessed address is not reached in step 320, the method latches the next address on the rising edge of signal CLK through the address pins with sufficient address setup time when the ADV# signal is set to low as shown in step 322. OE# signal is then set to low in step 324 so that the accessed data can be outputted in step 312.

If the accessed address is the last one, i.e., M equals to the address number Mmax of the last memory address to be accessed in step 320, the signal OE# is switched back to low in step 326 to read out the data of the last accessed address. The length of the burst read is checked against the length of latched burst data in step 328. If the length of the burst read has not been reached, the flow returns to step 326 to output the burst data. The length counter is incremented and the accessed 16-bit data are synchronously sent to output buffers upon each rising edge of CLK in step 326 with OE# being set to low until the whole consecutive data of the burst read are outputted. If the accessed data of total burst read length is finished, the OE# signal is set to high in step 330 to put all 16 output buffers in tri-state, and the memory is ready for the next operation in step 332.

Figure 12:
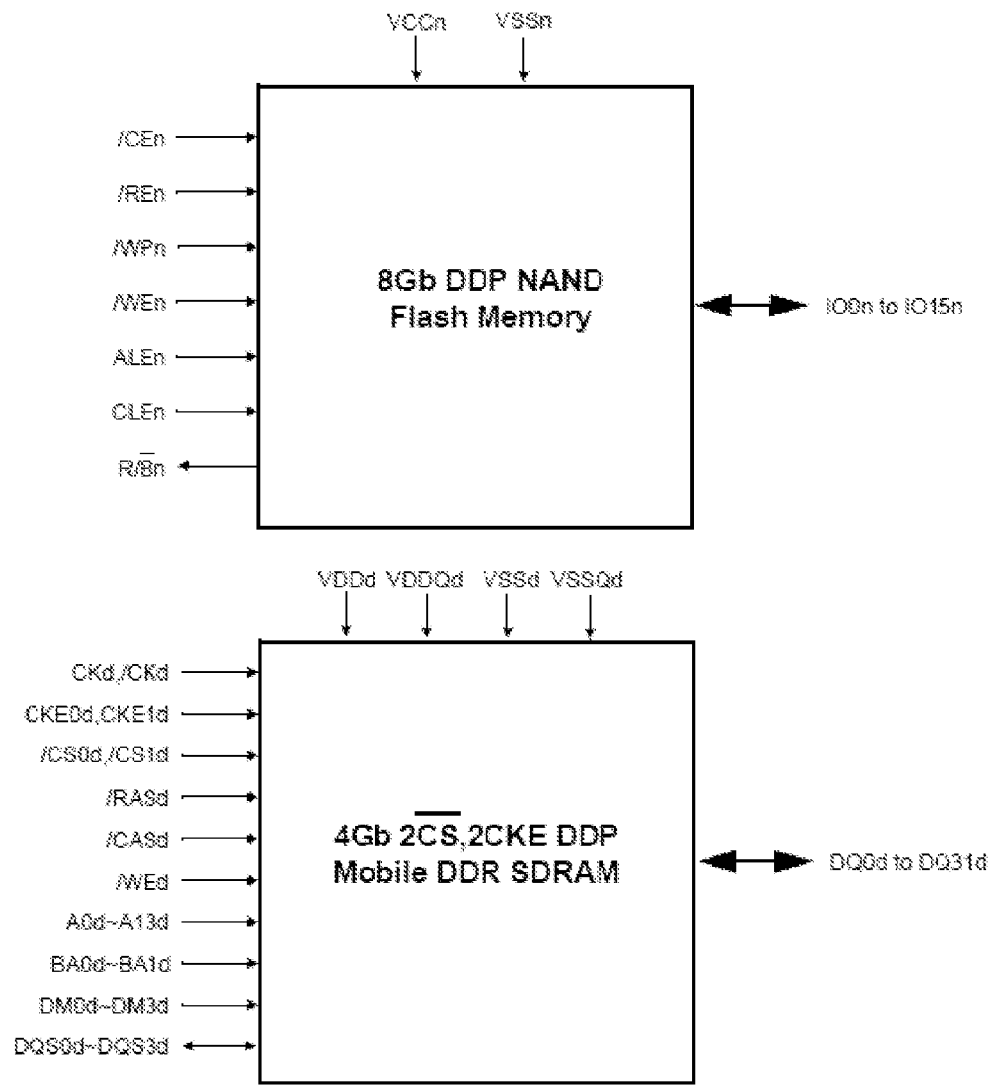
FIG. 12 shows a circuit block diagram of an MCP combo memory with 8 Gb asynchronous serial NAND flash and 4 Gb synchronous parallel DRAM.

FIG. 12 shows a circuit block diagram of an MCP combo memory with an asynchronous serial NAND flash memory and an asynchronous parallel DRAM for today's high-end mobile phone applications. The MCP combo memory comprises a NAND chip and a DRAM chip. The pin names and functions are defined in the tables shown in FIG. 13. Both memories share all the external pins. The power and ground lines are separated for the two memories to reduce noise coupling. The data inputs and outputs are also separated for the optimal fast read and write operations for the two memory chips.

FIG. 13 shows the pin assignment of the MCP combo memory in FIG. 12 for less than 8 Gb asynchronous serial NAND flash and less than 4 Gb asynchronous parallel DRAM. The upper table shows the pin assignment of the FBGA package of the MCP combo memory. The lower right table shows details of the pin names and functions for the serial NAND flash and the lower left table shows details of the pin names and functions for the parallel DRAM in the same MCP package.

For the parallel DRAM, there are two groups of address pins. One group comprises fourteen uni-directional address pins A0$d$-A13$d$ and the other group comprises two uni-directional pins BA0$d$-BA1$d$ for memory bank selection. Other pins include thirty-two bi-directional I/O pins DQ0$d$-DQ31$d$ with four data strobe pins DQS0$d$-DQS3$d$, two clock enable pins CKE0$d$ and CKE1$d$, two additional address control pins RASd and CASd, one write enable pin WEd, four Input data mask pins DM0$d$-DM3$d$, two power supply pins VDDd and VDDQd and two ground pins VSSd and VSSQd.

For the serial NAND flash, there are no address pins. The address bits are clocked in parallel with one clock into the on-chip stack registers of the NAND flash through sixteen bi-directional I/O pins 100$n$-1015$n$, where n stands for NAND. In addition, there are five enable pins CEn, REn, WPn, ALEn and CLEn, one ready/busy output pin R/Bn and one power supply pin VCCn and one ground pin VSSn.

Using the 16 address pins for addressing the serial NAND and parallel DRAM during read and write operations, the total addressable memory space for the DRAM is $2^{32} \times 32$ bits equivalent to 32 terra-bits, and the total addressable memory space for the NAND is $2^{32} \times 16$ equivalent to 16 terra-bits in the above MCP package. In the MCP combo memory, the DRAM is configured as 32 bit wide fast random access memory for code execution while the NAND flash is configured with 16-it wide only for slow serial audio and video but extremely high density data storage.

Figure 14:
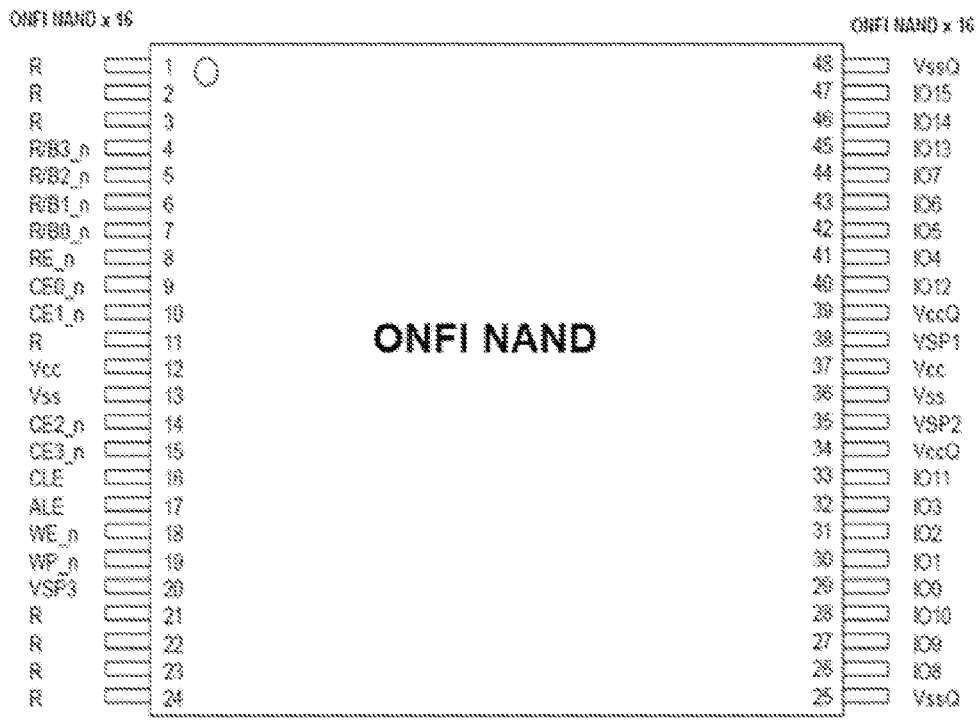
FIG. 14 shows a top view of the pin assignment of a traditional ONFI NAND package with ONFI pin assignment.

FIG. 14 shows a conventional 48 pin NAND package defined with ONFI pin assignment. The right side of the package includes one Vcc and two VccQ for three Vcc pins, one Vss and two VssQ for three Vss pins, VSP1 and VSP2, and sixteen bi-directional I/O pins 100 to 1015. On the left side, there are four ready/busy pins R/B0_$n$-R/B3_$n$, four chip-enable pins CE0_$n$-CE3_$n$, read enable pin RE_n, write-enable pin WE_n, write protection pin WP_n, address-latch pin ALE, VCC, VSS and a few other un-used pins. Some undefined pins are specified as "R".

Figure 15:
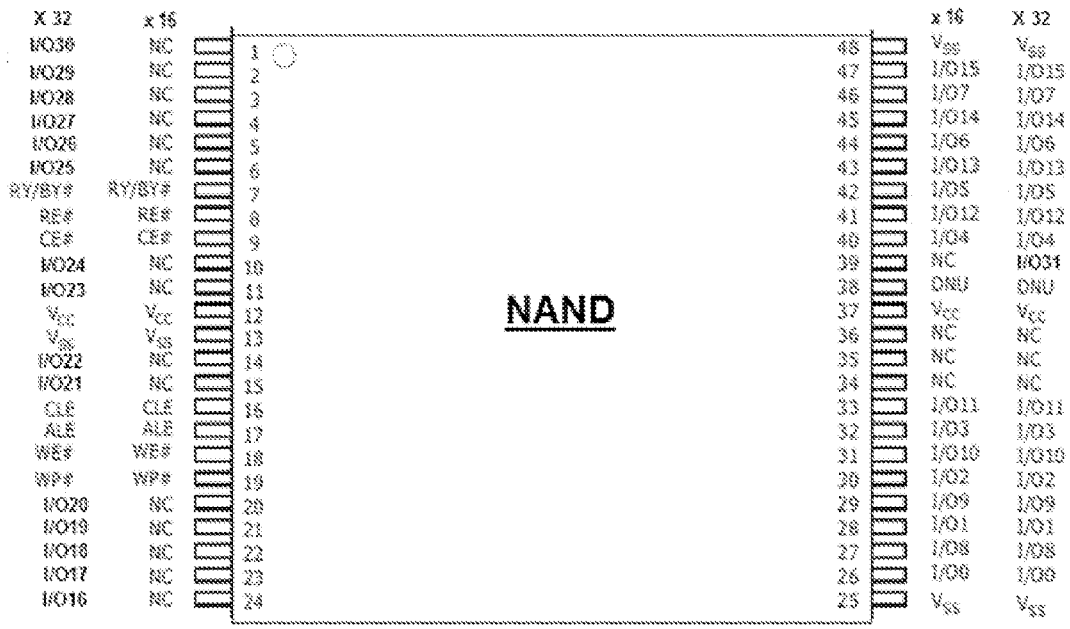
FIG. 15 shows the top view of a 48 pin NAND package with the preferable pin assignment of the present invention.

FIG. 15 shows a 48 pin NAND package with the preferred pin assignment according to the present invention. There are two options for the preferred pin definition to allow the number of I/O pins to be expandable from sixteen to thirty-two. The pin assignment shown on the right side of the package is preferably made compatible with the X16 I/O package of an ONFI NAND flash. On the left side, the pin assignment is made compatible with the popular extra sixteen I/O pin assignment. When a NOR flash is built on chip with a NAND flash on the same die, it is preferred that the chip has fixed 48 pins regardless of the sixteen or thirty-two I/O pins of the present invention.

Figure 16:
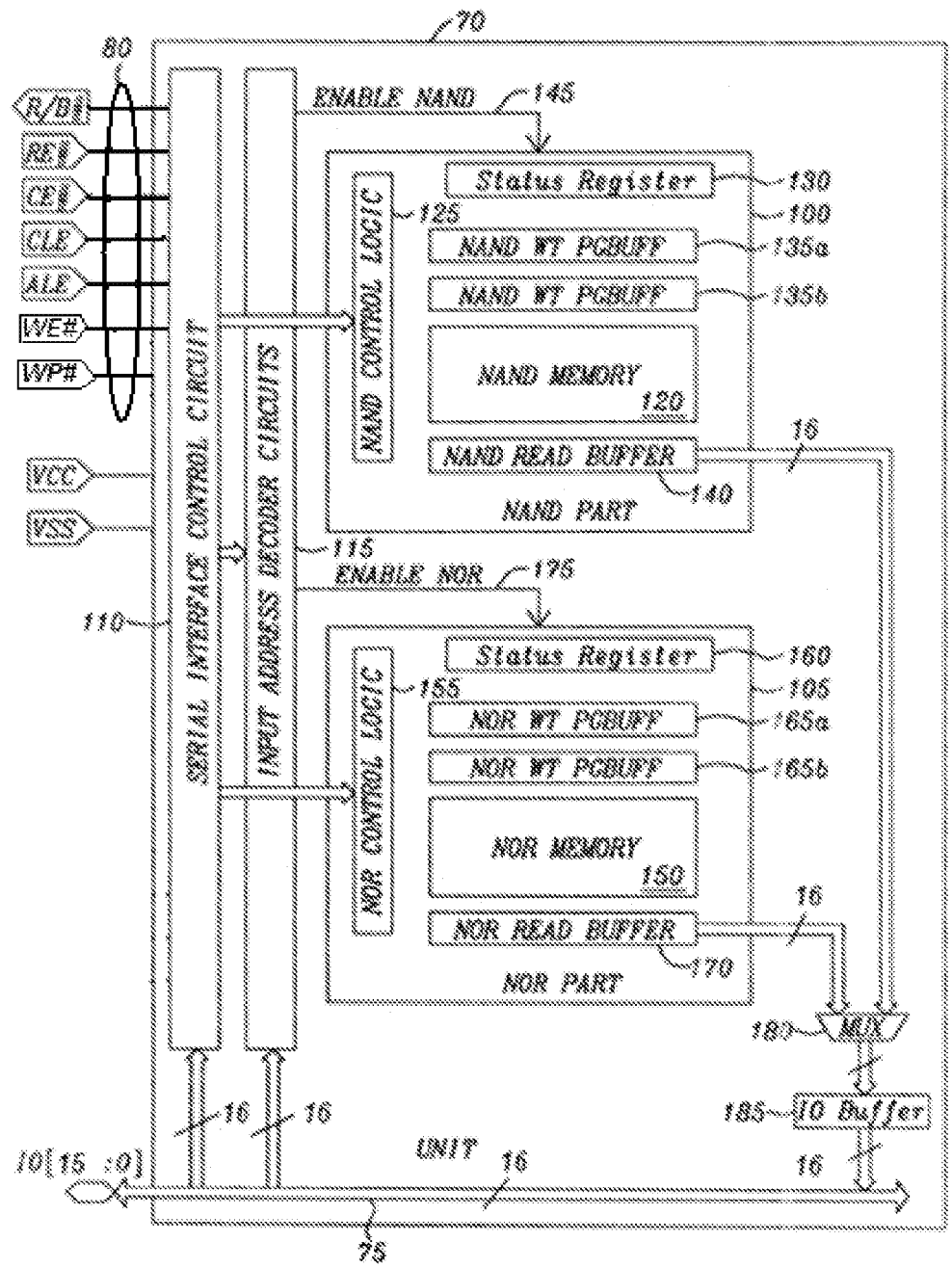
FIG. 16 shows a circuit block diagram of a combo flash memory with both NAND flash and NOR flash on a same die and in the same package of the present invention.

FIG. 16 shows an exemplary circuit block diagram 70 of a combo flash of the present invention. The combo flash contains one NAND flash and one NOR flash on the same IC die and encapsulated in the same package. More NAND flash and NOR flash can be integrated as well depending the memory requirement in the application. Both memories share the same pin assignment and power supplies VCC and VSS. For example, the signals 80 show the shared pins R/B#, RE#, CE#, CLE, ALE, WE# and WP#. No address pins are assigned in the NAND package. There are also sixteen shared bi-directional IO pins IO[15:0] of a traditional 48 pin NAND package. However, for the preferred thirty-two I/O pins, the block diagram of the combo chip should be compatible with the additional sixteen more IO pins to allow a 32 bit CPU to access within one clock cycle.

Figure 17:
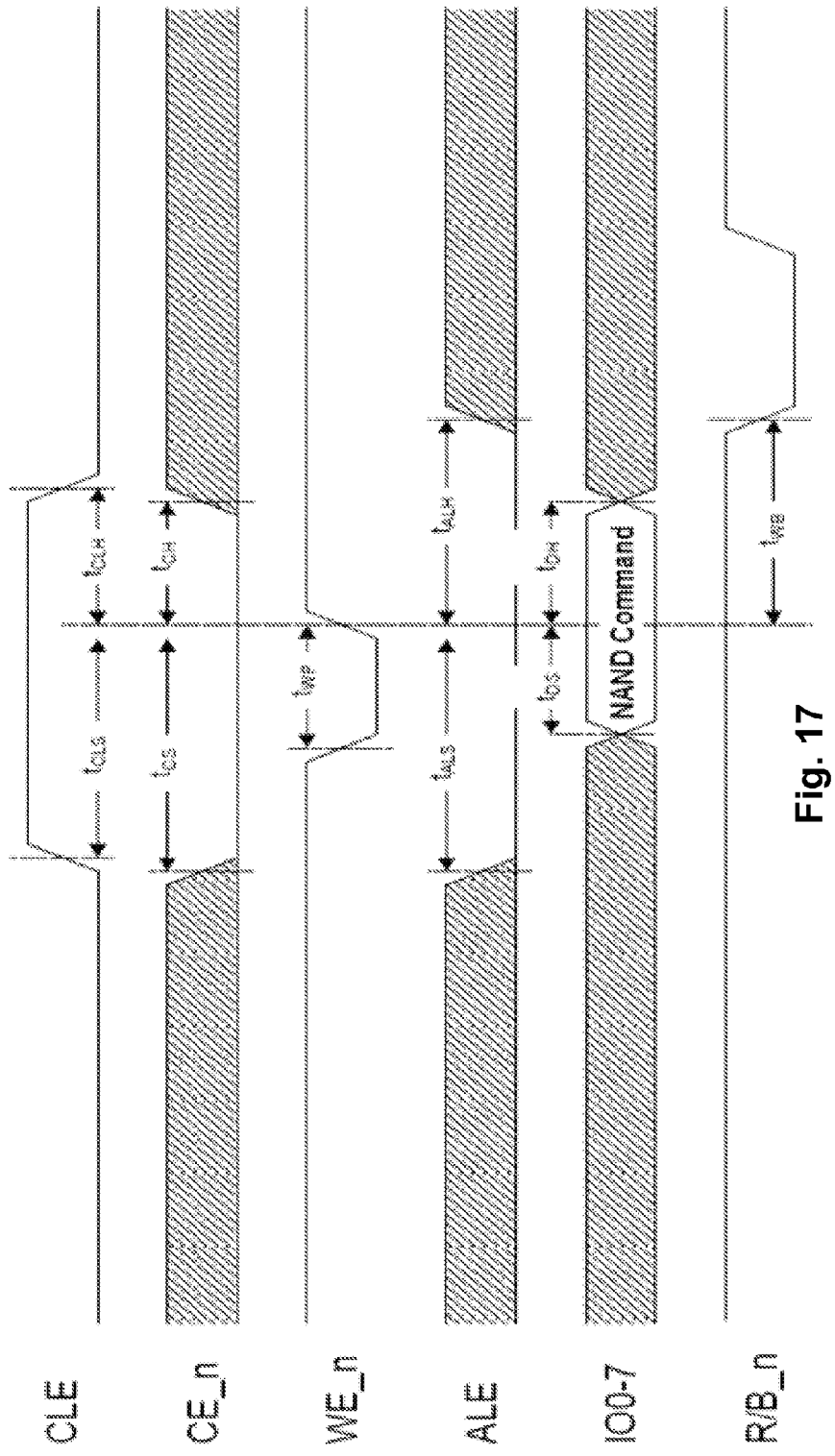
FIG. 17 shows a set of timing waveforms of the NAND command latch for x8, x16 or x32 in the 48 pin NAND package of the present invention.

FIG. 17 shows a set of preferred timing waveforms of a NAND command latch for 8 bits (X8), 16 bits (X16) or 32 bits (X32) in a NAND package of the present invention. It is compatible with the mainstream timing waveforms and control pins of a state-of-the-art 48 pin NAND flash. The command data set up time is $t_{DS}$. The command data are latched upon the rising edge of WE_n when ALE, CE_n are set to low but CLE and R/B_n are set to high. The latched data width can be 8 bits (X8), 16 bits (X16) or 32 bits (X32) depending on the width of the IO pins.

Figure 18:
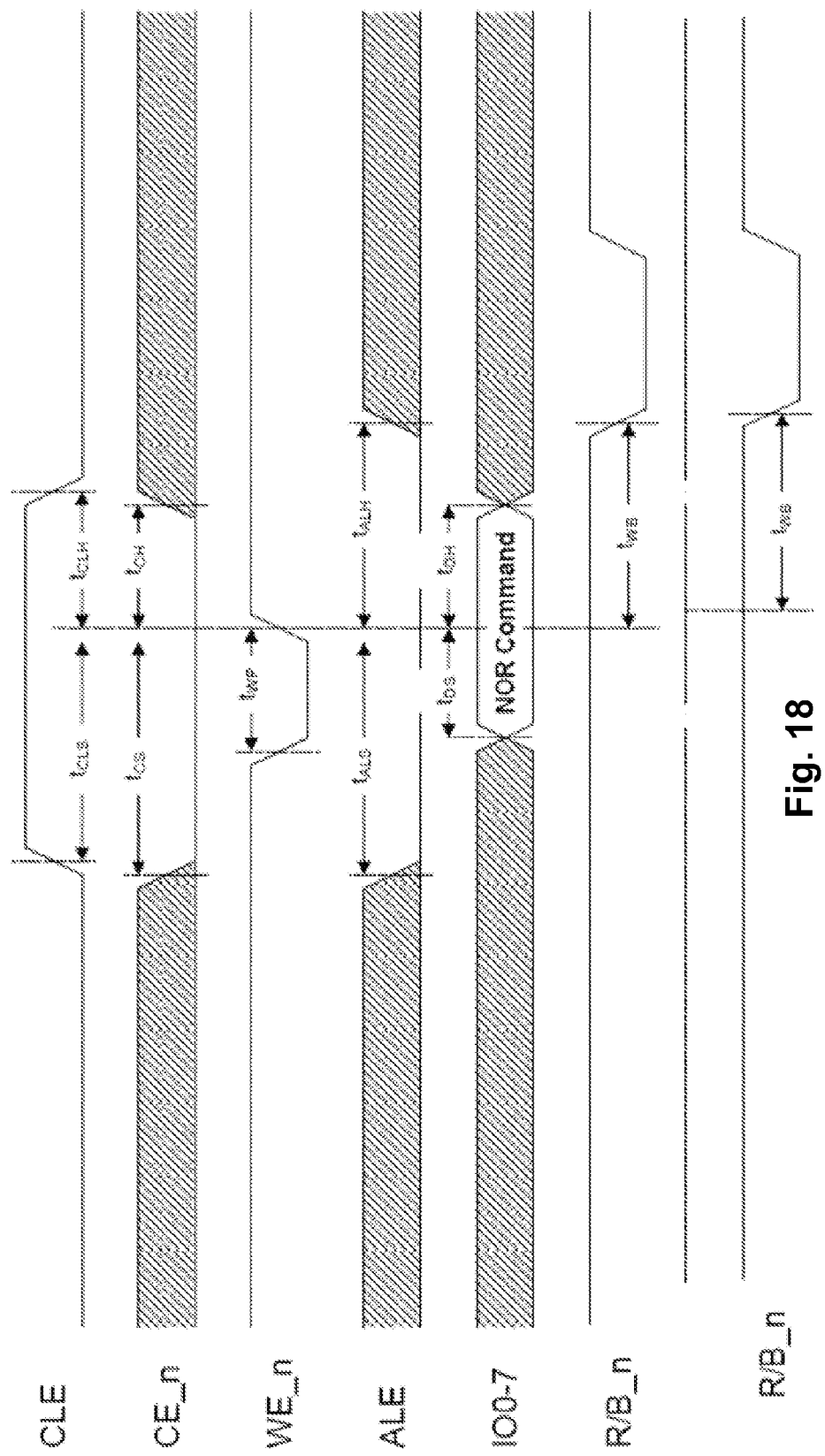
FIG. 18 shows a set of timing waveforms of the NOR command latch for x8, x16 or x32 in the same 48 pin NAND package of the present invention.

FIG. 18 shows a set of preferred timing waveforms of a NOR command latch of the present invention for X8, X16 or X32 but configured in a NAND package. It complies with the mainstream timing waveforms and control pins of a state-of-the-art 48 pin NAND flash. The command data set up time is $t_{DS}$. The command data are latched upon the rising edge of WE_n when ALE, CE_n are set low but CLE and R/B_n are set to high. The latched data width can be 8 bits (X8), 16 bits (X16) or 32 bits (X32) depending on the width of the IO pins. The command is decoded in unit of 8 bits.

FIG. 19 shows a table that contains the details of all pin assignment, pin definition, command codes and key functions of read, erase and several types of program operations of a traditional ONFI NAND package. The command set includes read, program and erase commands in addition to set and reset commands.

FIG. 20 shows a table that adds several new commands and operations of a NOR flash into a traditional ONFI NAND package for the preferred combo flash operations on an ONFI 48 pin package according to the present invention. The preferable address bits can be flexibly increased from 16 to 48 to provide extremely high density for both NAND flash and NOR flash beyond 1 Tb. There are three types of read operations, depending on the memory density encapsulated inside the package. Seven new commands are preferably added into the existing NAND command set without any conflict in code definition in accordance with the present invention.

Figure 21:
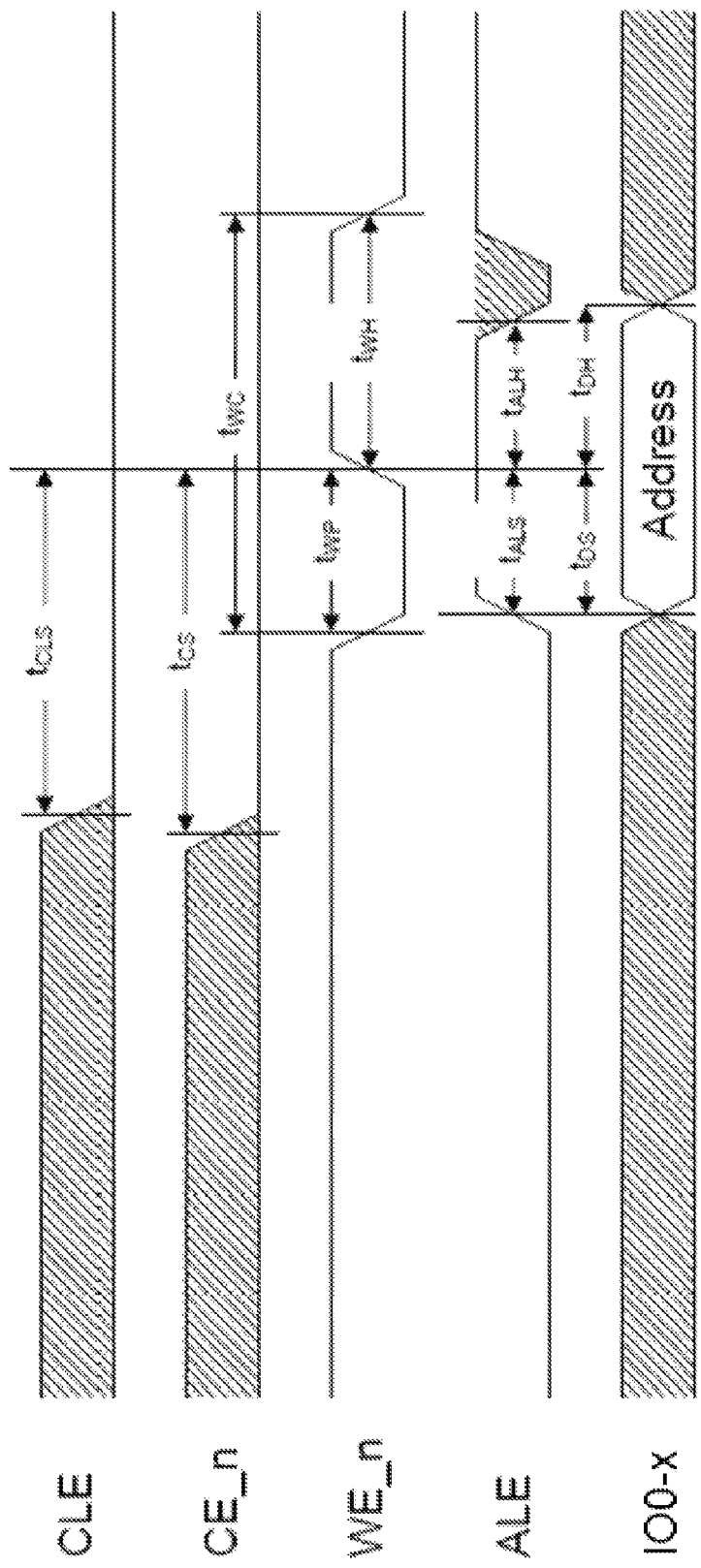
FIG. 21 shows a set of preferred timing waveforms of the address latch used by both NOR flash and NAND flash on the same die and in the same package of the combo flash memory of the present invention.

FIG. 21 shows a set of preferred timing waveforms of an address latch to be used by both the NOR flash and the NAND flash on the same die and in the same package of the present invention. The address data are latched upon the rising edge of WE_n when both CLE and CE_n pins are set to low. The (x+1) address bits are latched into the on-chip stack registers through the available (x+1) I/O pins IO0-x. The address data hold time is defined as $t_{DS}$ for both the NAND flash and the NOR flash on the same die of the present invention.

Figure 22:
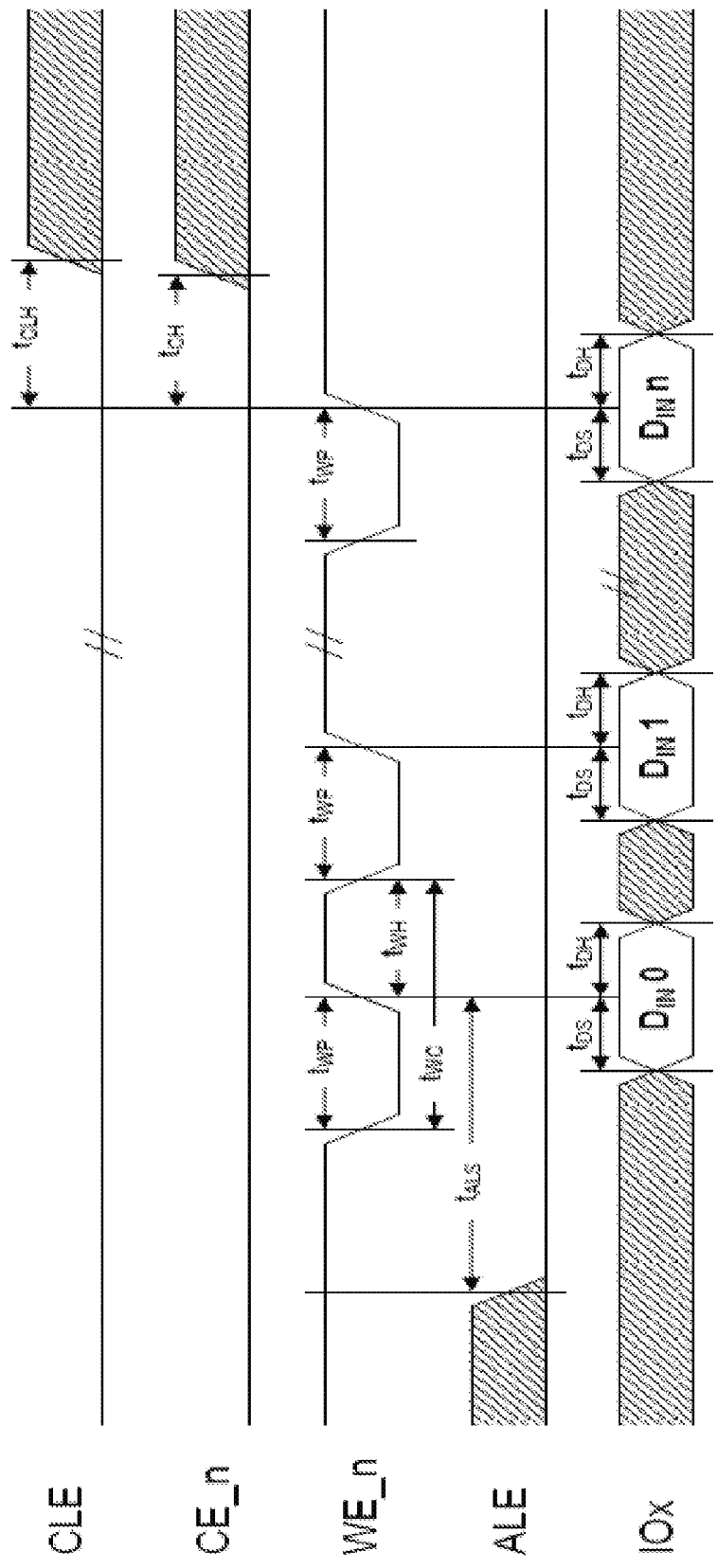
FIG. 22 shows a set of preferred timing waveforms of the data input used by both the NOR flash and NAND flash on the same die and in the same package of the combo flash memory of the present invention.

FIG. 22 shows a set of preferred timing waveforms of a data Input to be used by both the NOR flash and the NAND flash on the same die and in the same package of the present invention. The input data are latched upon the rising edge of each WE_n cycle when CLE, ALE and CE_n pins are set to low. The data bits are latched into the on-chip stack registers through the available bi-directional IO pins IOx. Similarly, the accessed data hold time is defined as $t_{DS}$ for both the NAND and the NOR in the same die of the present invention.

Figure 23:
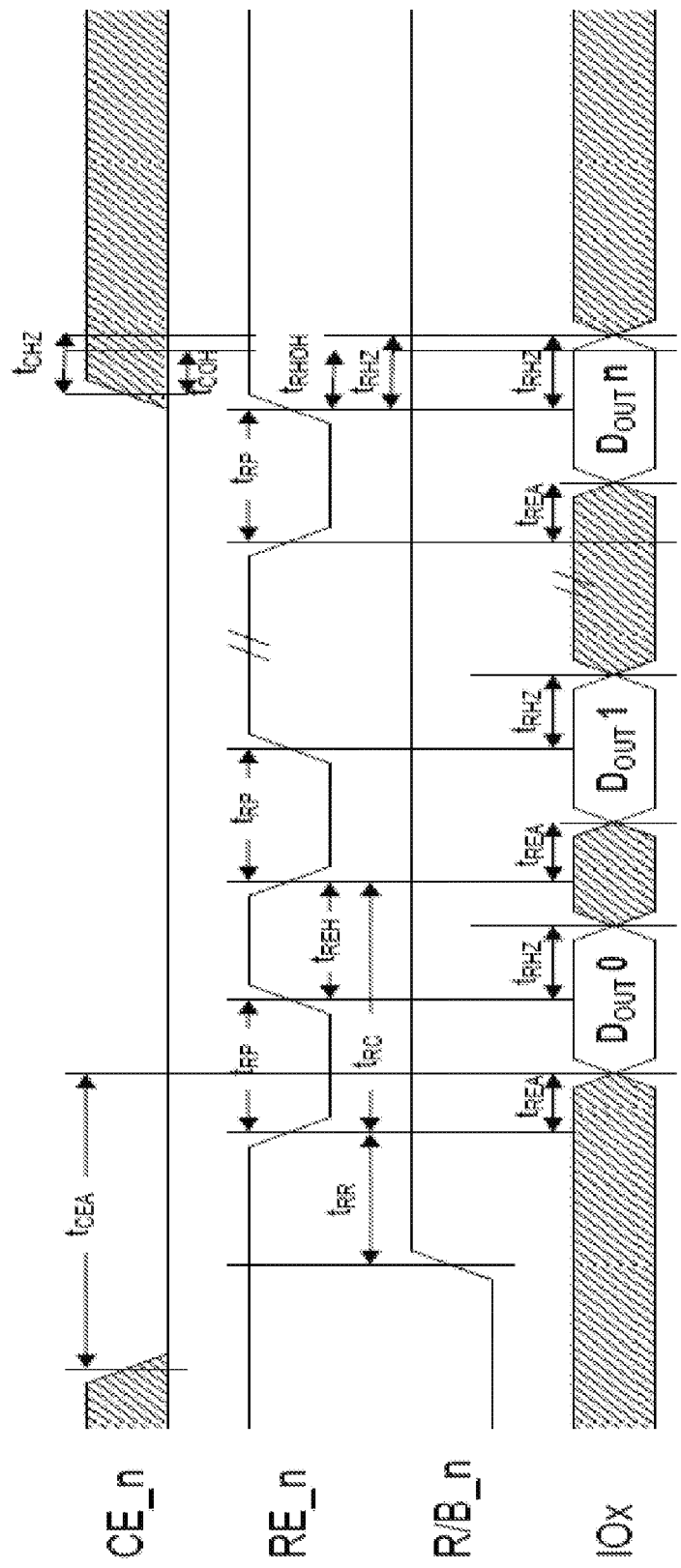
FIG. 23 shows a set of preferred timing waveforms of the data output used by both the NOR flash and NAND flash on the same die and in the same package of the combo flash memory of the present invention.

FIG. 23 shows a set of preferred timing waveforms of a data output to be used by both the NOR flash and the NAND flash on the same die and in the same package of the present invention. The output data are latched upon the rising edge of each WE_n cycle when CE_n pin is set to low but R/B_n is set to high. The output data bits can be synchronously read into the off-chip registers in the host CPU upon each rising edge of RE_n signal as shown.

Figure 24:
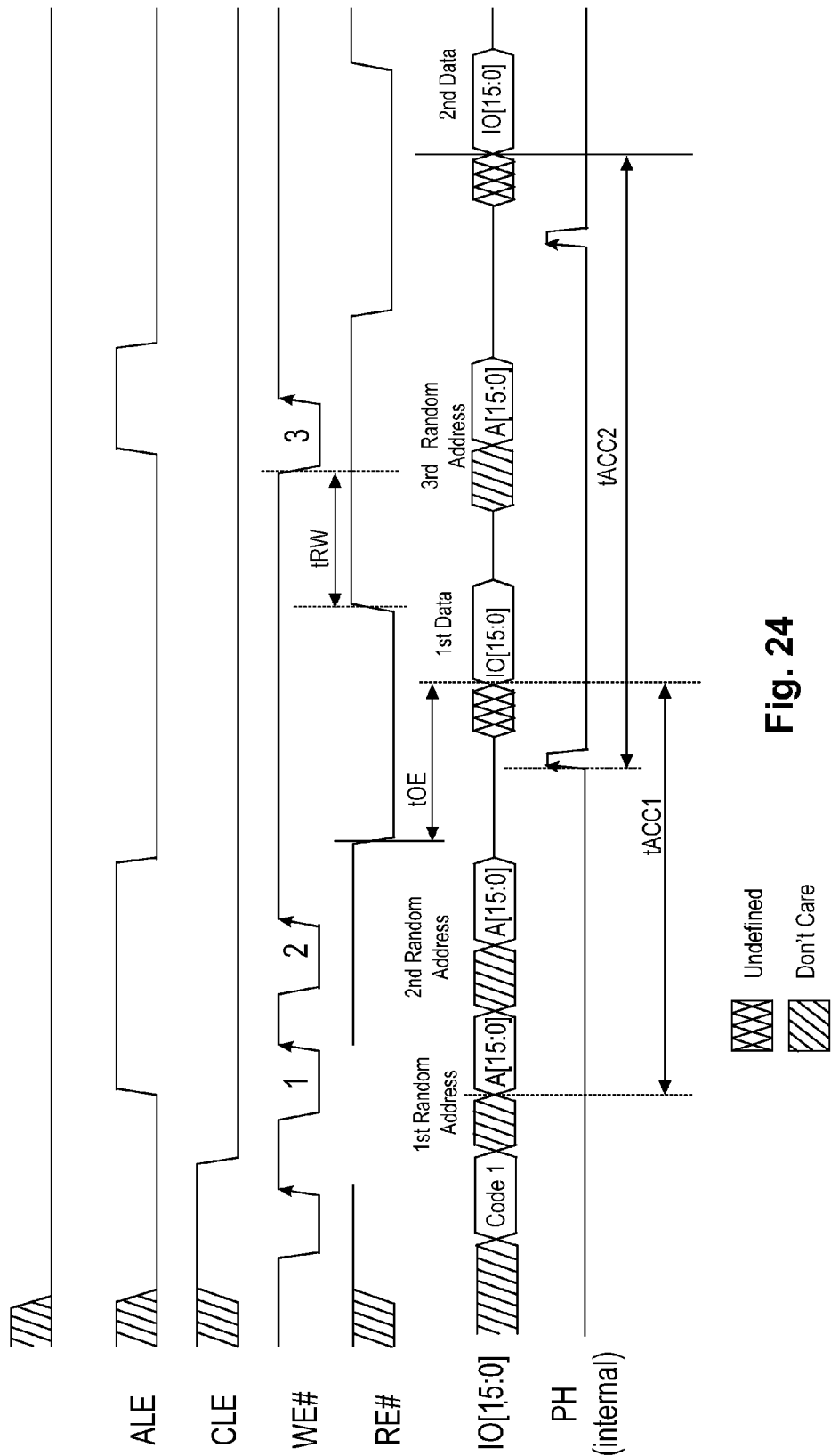
FIG. 24 shows a set of preferred timing waveforms of a random read operation of the NOR flash on the same die and in the same package of the combo flash memory of the present invention with 16 bit address data latched through 16 IO pins.

FIG. 24 shows a set of preferred timing waveforms of a random read operation of the NOR flash on the same die and in the same package with the NAND flash of the combo flash design of the present invention. The 16 address data bits are latched into on-chip stack registers upon the rising edge of WE_n when CLE, ALE and CE_n pins are held to low through the 16 IO pins IO[15:0]. There are two types of random access delays such as the slower one tACC1 of the $1^{st}$ access and the faster one tACC2 of the $2^{nd}$ access. In order to precisely control the shift of data of the currently accessed address for faster random read speed, an internal tracking signal PH is preferably generated on-chip.

Figure 25:
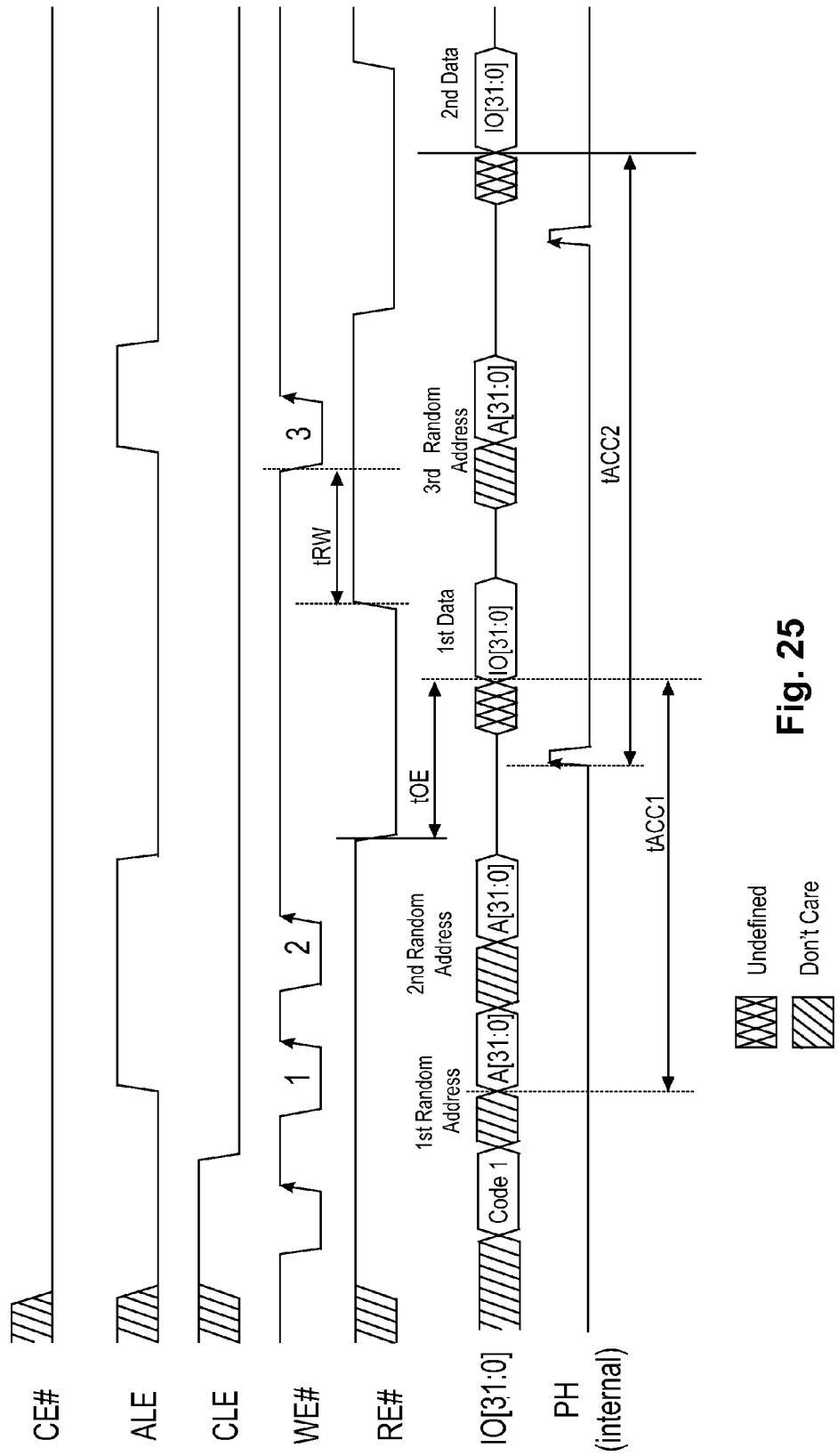
FIG. 25 shows another set of preferred timing waveforms of a random read operation of the NOR flash on the same die and in the same package of the combo flash memory of the present invention with 32 bit address data latched through 32 IO pins.

FIG. 25 shows another set of preferred timing waveforms of a random read operation of the NOR flash design on the same die and in the same package with the NAND flash of the combo flash design of the present invention. The 32 address data bits are latched into on-chip stack registers upon the rising edge of WE_n when CLE, ALE and CE_n pins are held to low through the 32 IO pins IO[31:0]. Similar to FIG. 24, there are two types of random access delays such as the slower one tACC1 of the $1^{st}$ access and the faster one tACC2 of the 2nd access. In order to precisely control the shift of data of the currently accessed address for faster random read speed, an internal tracking signal PH is preferably generated on-chip. The address bits of the currently accessed data are latched in the previous cycle to reduce the delay of the input buffer and the output buffer. As a result, the random access read speed of the NOR flash in the combo flash is greatly improved.

Figure 26:
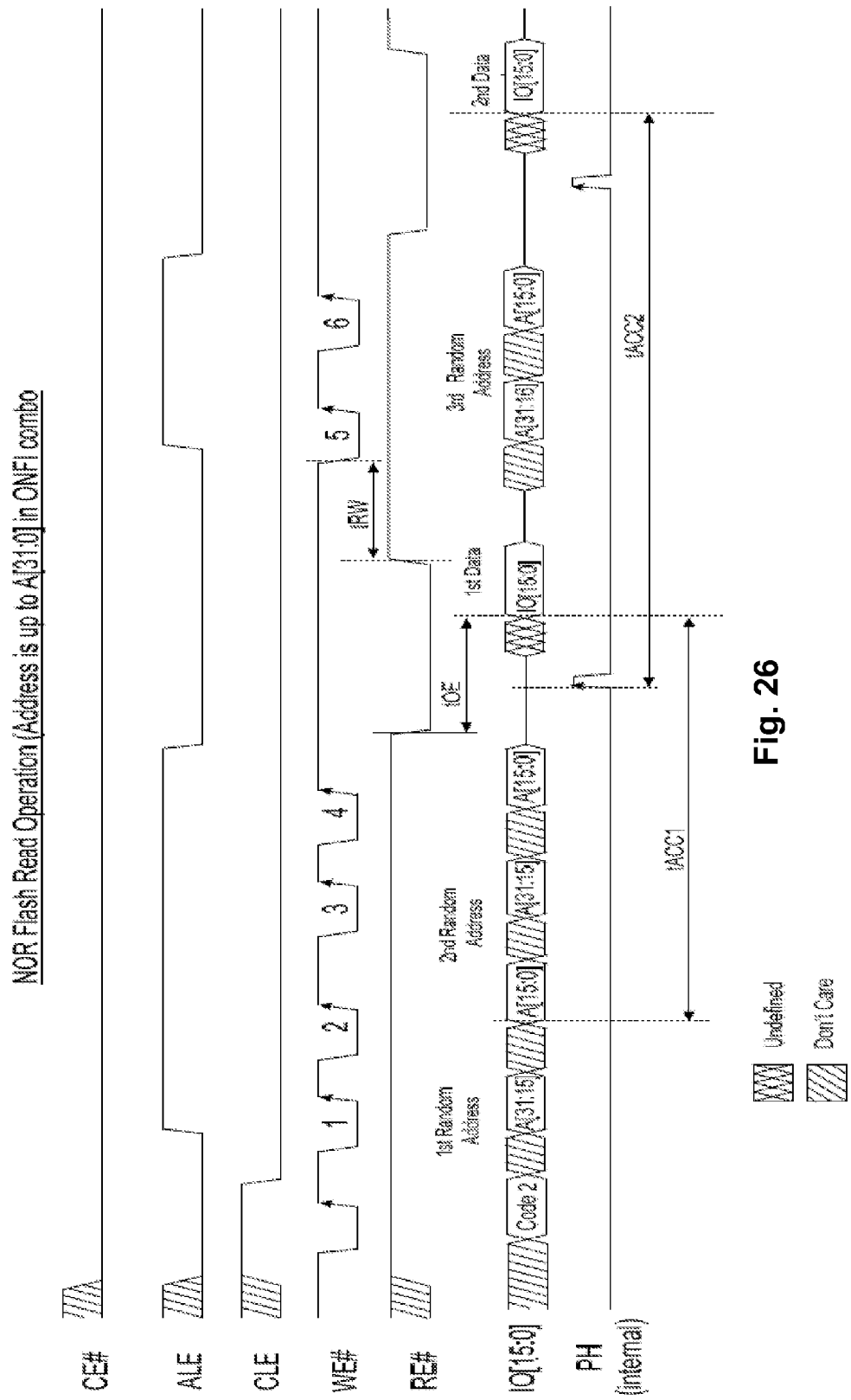
FIG. 26 further shows another set of preferred timing waveforms of a random read operation of the NOR flash on the same die and in the same package of the combo flash memory of the present invention with 32 bit address data latched through 16 IO pins.

FIG. 26 further shows another set of preferred timing waveforms of a random read operation of the NOR flash on the same die and in the same package with the ONFI NAND flash of the combo flash design of the present invention. The 32 address bits are latched into on-chip stack registers upon two consecutive rising edges of WE_n when CLE, ALE and CE_n pins are held to low through the 16 IO pins IO[15:0]. Similar to FIG. 24, there are two types of random access delays such as the slower one tACC1 of the $1^{st}$ access and the faster one tACC2 of the $2^{nd}$ access. In order to precisely control the shift of data of the currently accessed address for faster random read speed, an internal tracking signal PH is preferably generated on-chip. Similarly, the address bits of the currently access data are latched in the previous cycle to reduce the delay of the input buffer and the output buffer. As a result, the random access read speed of the NOR flash in the combo flash is greatly improved.

Figure 27:
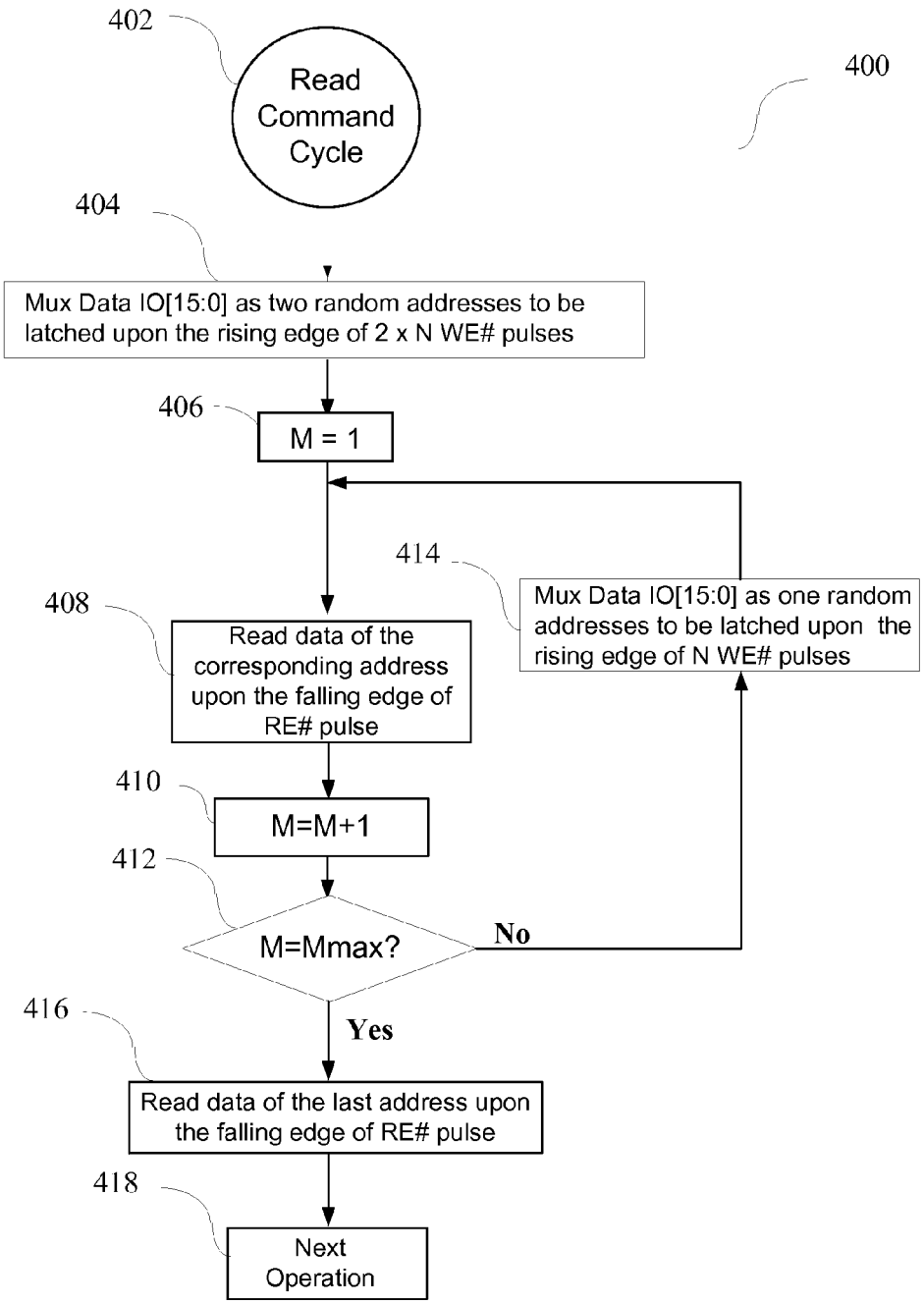
FIG. 27 shows the method and flow of the corresponding control sequence and timing waveforms of FIG. 26 for the random read operation of the NOR flash according to the present invention.

FIG. 27 shows the novel method and flow 400 for the corresponding control sequence and timing waveforms illustrated in FIG. 26 for the NOR flash of the combo flash memory of the present invention. The flow defines the preferred steps of the asynchronous mode read operation for the ONFI NAND package that contains 16 bi-directional pins IO[15:0] and some uni-directional address pins as being popularly used in the high-end smart mobile phone applications.

The method 400 for the NOR flash read operation in an ONFI combo memory of the present invention starts from an asynchronous read command 402. In step 404, the multiplexed data IO[15:0] are used as two random addresses and latched upon the rising edges of two cycles of N WE# pulses. The number of N WE# pulses depends on the memory address space. For N=1, 2 and 3, the memory addresses are up to $2^{16}$, $2^{32}$ and $2^{48}$ respectively.

In step 406, a counter M is reset to 1. The counter M is set to store the address number of the currently accessed memory data that are to be read out. Before the currently accessed memory data are outputted, the memory address has to be latched. In a conventional asynchronous read operation, only the current address is latched before the currently addressed data are ready. But in the novel approach of the present invention, the next address to be accessed is preferably latched before each currently accessed data are outputted.

In step 408, there are two addresses latched and the data of the first latched address are read out as the currently accessed data upon the falling edge of the RE# pulse. In step 410, the counter is incremented by one. The incremented counter is checked in step 412. If the last accessed address is not reached in step 412, the multiplexed data IO[15:0] are used as the next random address and latched upon the rising edge of one cycle of N WE# pulse as shown in step 414 before the currently accessed data are outputted in step 408.

If the accessed address is the last one in step 412, the data of the last address are read out upon the falling edge of the RE# pulse in step 416 to complete the read command and the method is ready for the next memory operation in step 418.

Figure 28:
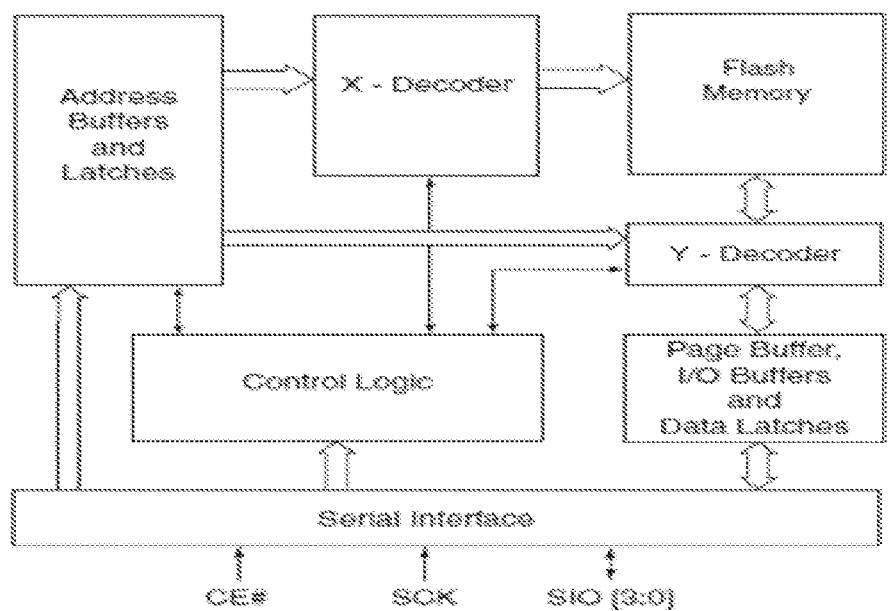
FIG. 28 shows a circuit block diagram of a conventional 8 pin SQI serial NOR flash memory.

FIG. 28 shows a circuit block diagram of a conventional 8-pin serial quad I/O (SQI) serial NOR flash memory which has four I/O pins SIO[3:0] along with SCK pin, CE# pin, and VDD and VSS pins. The SQI serial NOR flash is extensively used for code storage to replace the parallel NOR flash that requires more pins than 8 because the SQI serial NOR flash has the advantage of a small foot print to allow code XIP (execution-in-place).

The difference between the popular serial peripheral interface (SPI) and SQI interface is the number of I/O pins. The traditional SPI has only ONE I/O pin for data, address and command sets to be inputted and outputted. Because the SQI has four I/O pins, the SQI data clock rate is 4× faster than SPI. As a result, the SQI flash used as XIP code storage has the advantage of having much less pins as compared to the parallel NOR that requires 56 pins when the memory density is more than 128 Mb. However, a 58 pin parallel NOR has faster random read speed than the 8 pin SQI serial NOR.

Figure 29:
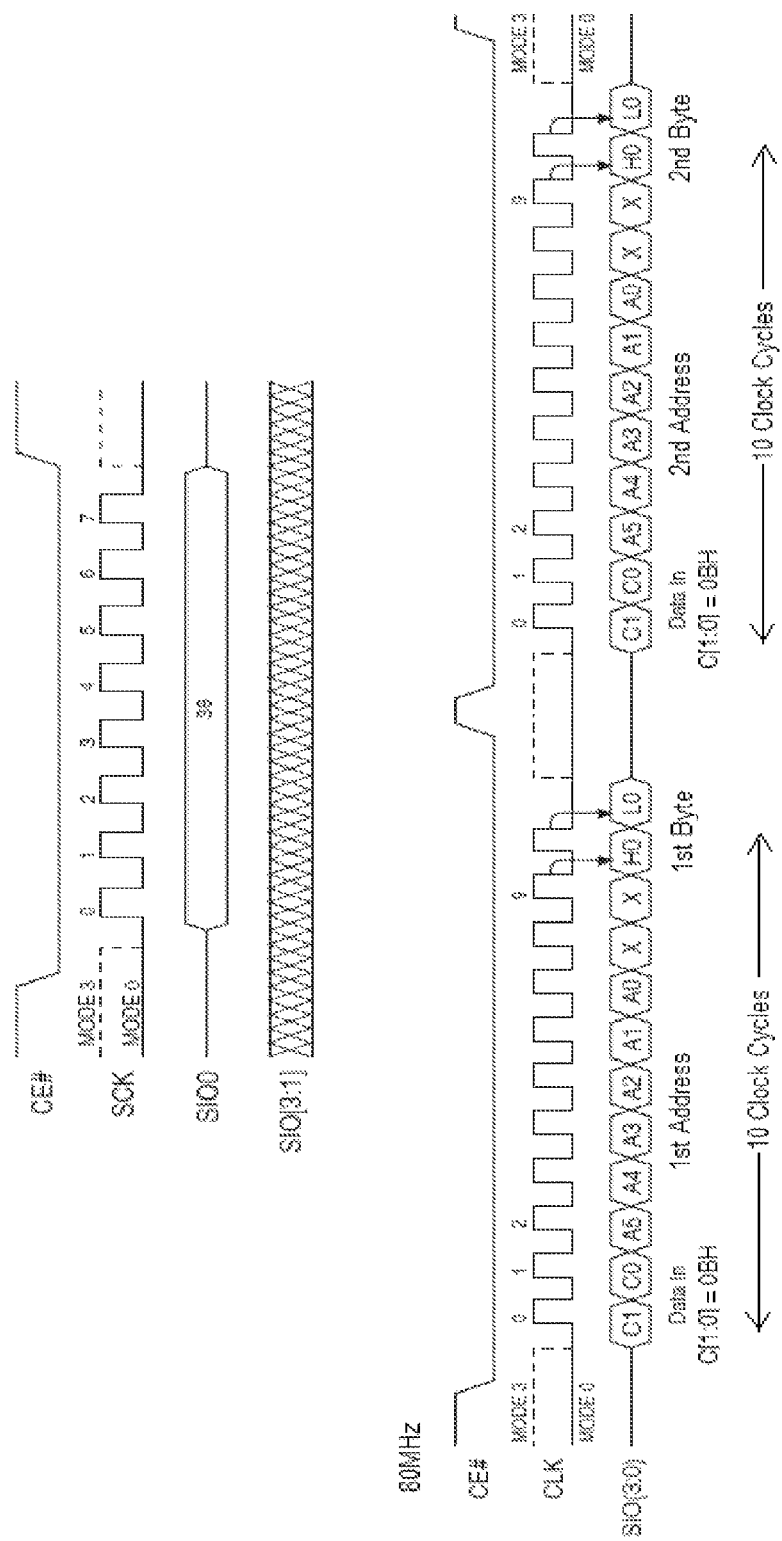
FIG. 29 shows a set of timing waveforms of the serial SQI NOR in an 8 pin package of Silicon Storage Technology.

FIG. 29 shows one set of timing waveforms of the serial SQI NOR in an 8 pin package of Silicon Storage Technology. All input and output code data, address data, and command data are synchronously clocked into the SQI NOR flash through the four IO pins SIO[3:0] when CE# is held at ground level. The length of clocks required depends on the memory density. The currently accessed data bits are clocked out in unit of 4 bits sequentially with the current address being inputted and latched in unit of four in previous cycles. The speed of the SQI NOR flash is relatively slow.

Figure 30:
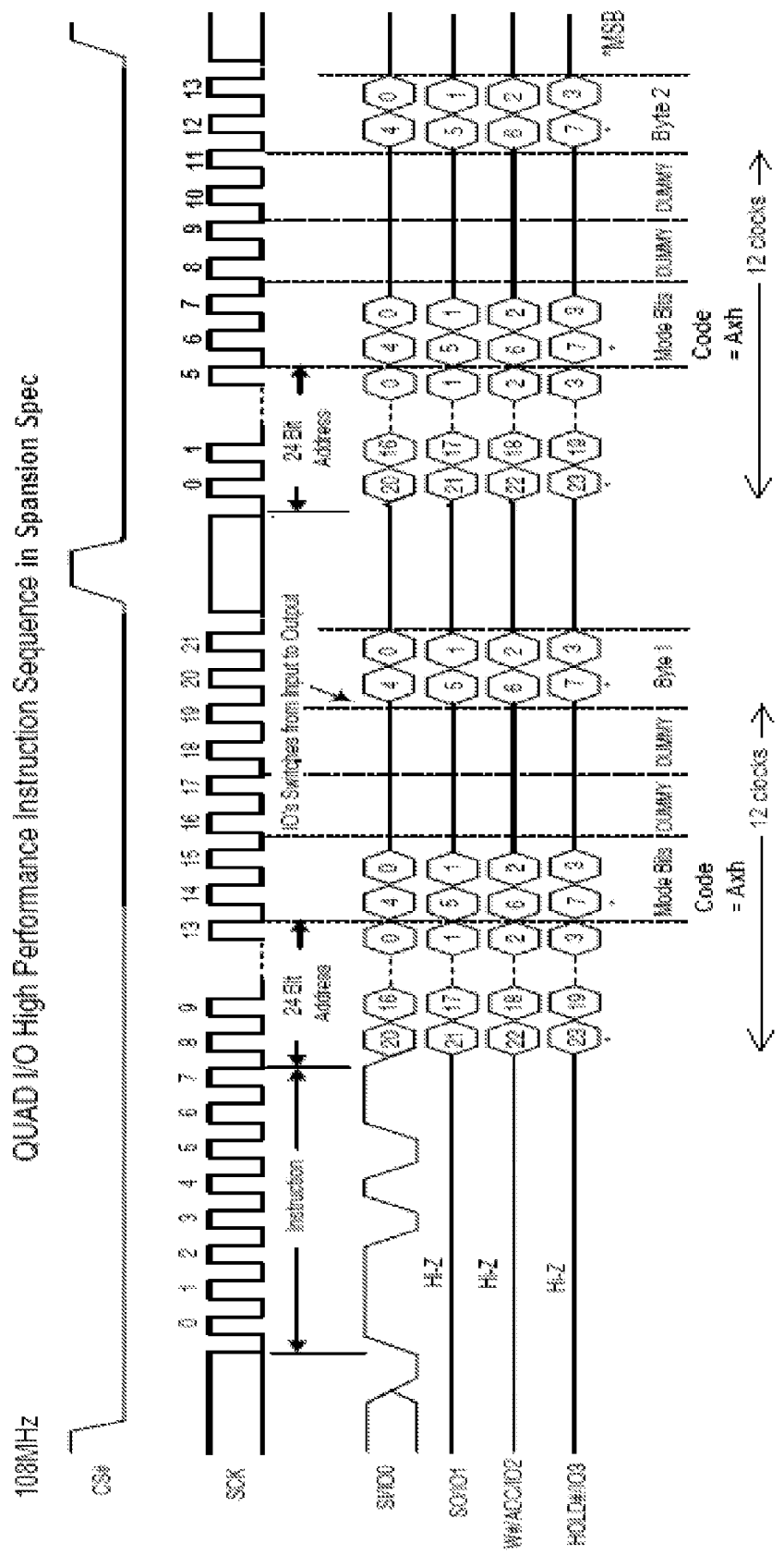
FIG. 30 shows a set of timing waveforms of the serial SQI NOR in an 8 pin package of Spansion.

FIG. 30 shows another set of timing waveforms of the serial SQI NOR in an 8 pin package of Spansion. All input and output code data and address data are synchronously clocked into the SQI NOR flash through the four IO pins SIO[3:0] when CE# is held at ground level. But the command data are clocked into the serial NOR only through one pin DQ0 with three pins DQ1-DQ3 being in "don't-care" condition.

The length of clocks required depends on the memory density. The currently accessed data bits are clocked out in unit of 4 bits sequentially with the current address being inputted and latched in unit of four in previous cycles. The speed of the SQI NOR flash is relatively slow.

Figure 31:
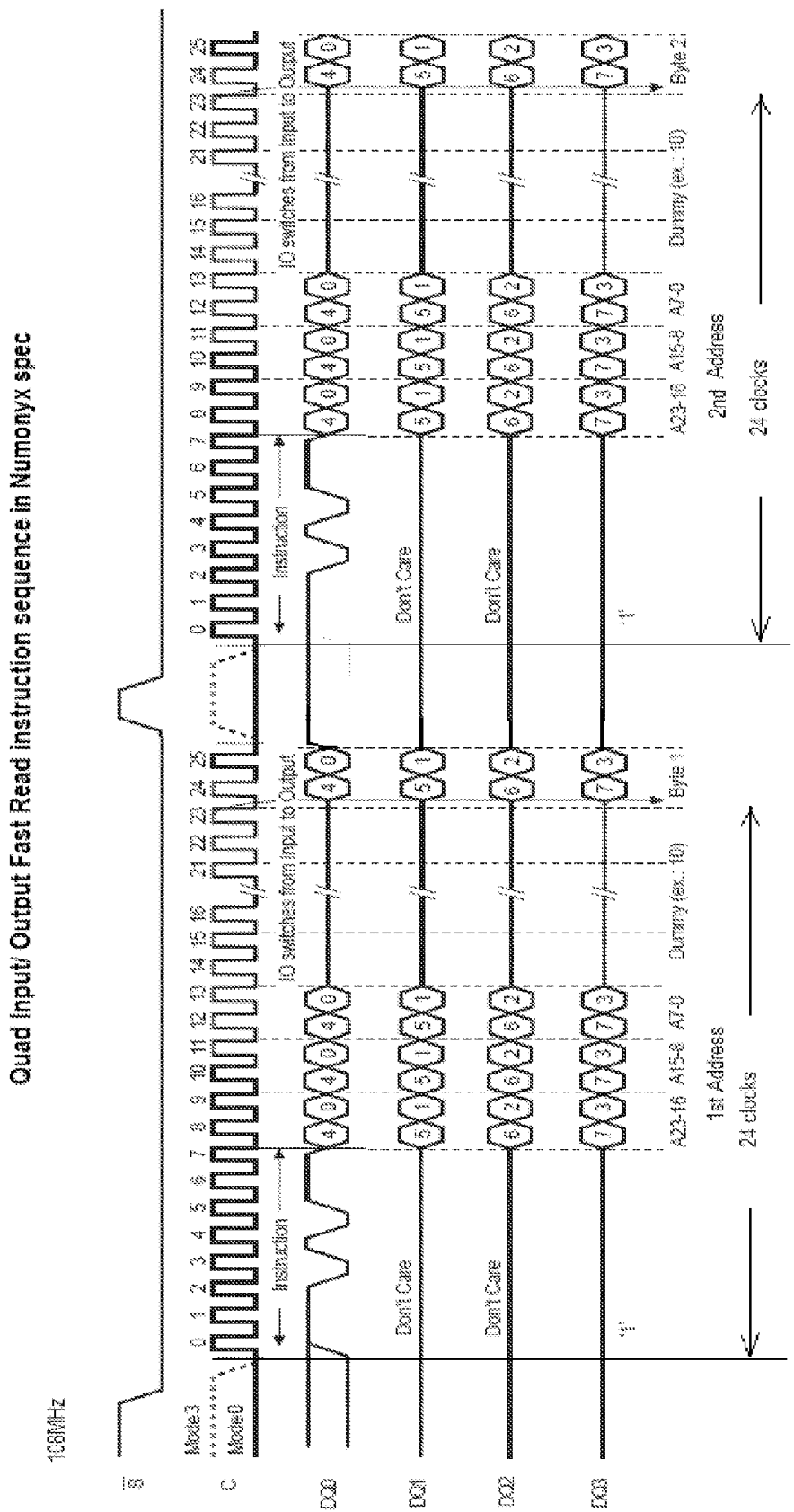
FIG. 31 shows a set of timing waveforms of the serial SQI NOR in an 8 pin package of Nymonix.

FIG. 31 shows another set of timing waveforms of the serial SQI NOR in an 8 pin package of Nymonix. Similar to the SQI NOR of Spansion, all input and output code data and the address data are synchronously clocked into the SQI NOR flash through the four IO pins SIO[3:0] when CE# is held at ground level. But the command data are clocked into the serial NOR only through one pin DQ0 with three pins DQ1-DQ3 being in "don't-care" condition.

The length of clocks required depends on the memory density. The currently accessed data bits are clocked out in unit of 4 bits sequentially with the current address being inputted and latched in unit of four in previous cycles. The speed of the SQI NOR flash is relatively slow.

Figure 32:
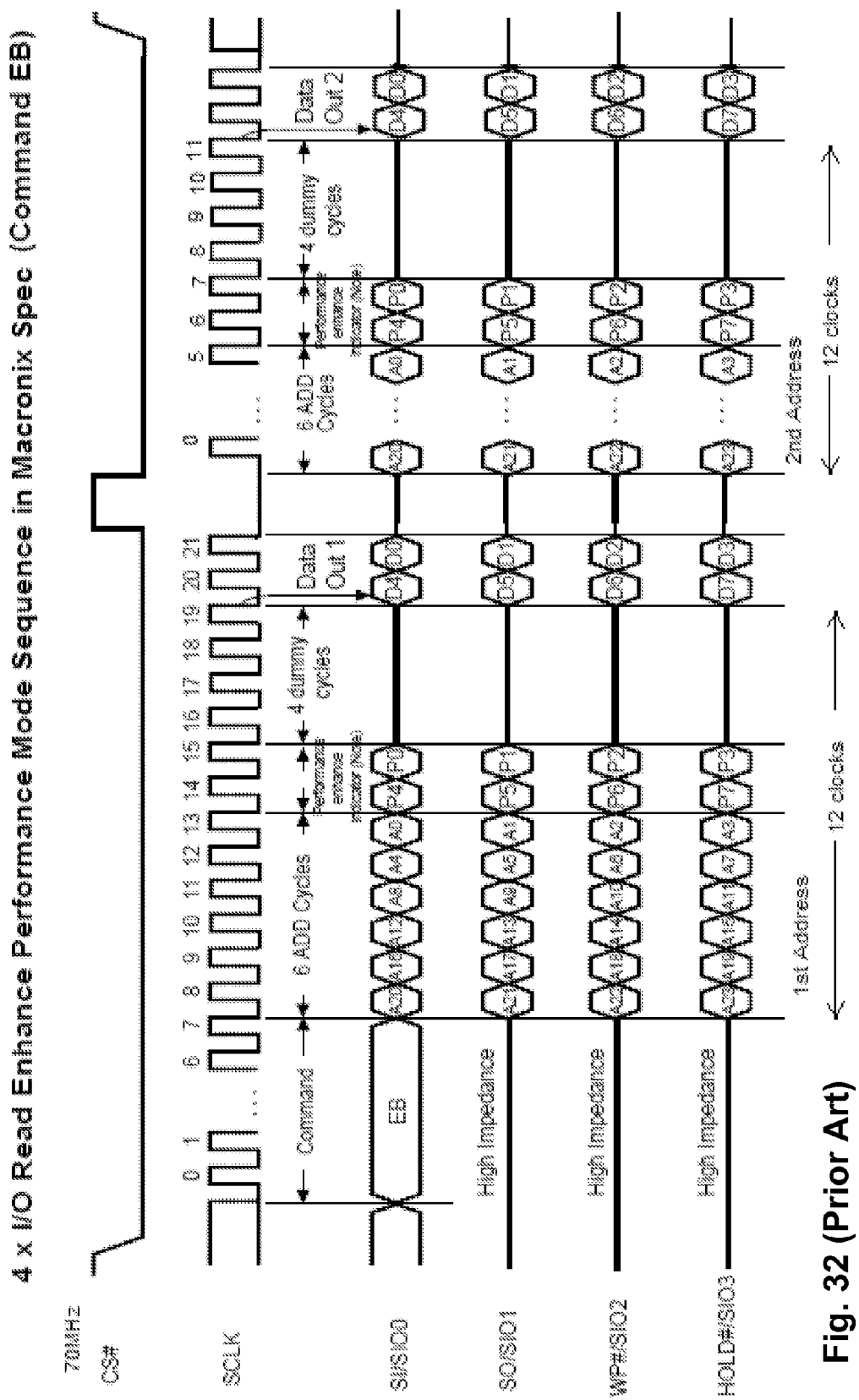
FIG. 32 shows a set of timing waveforms of the serial SQI NOR in an 8 pin package of Macronix.

FIG. 32 still shows another set of timing waveforms of the serial SQI NOR in an 8 pin package of Macronix. Similar to Spansion, all input and output code data and the address data are synchronously clocked into SQI NOR flash through the four IO pins SIO[3:0] when CE# is held at ground level. But the command data are clocked into the serial NOR only through one pin DQ0 with three pins DQ1-DQ3 being in "don't-care" condition.

The length of clocks required depends on the memory density. The currently access data bits are clocked out in unit of 4 bits sequentially with the current address being inputted and latched in unit of four in previous cycles. The speed of the SQI NOR is relatively slow.

Figure 33:
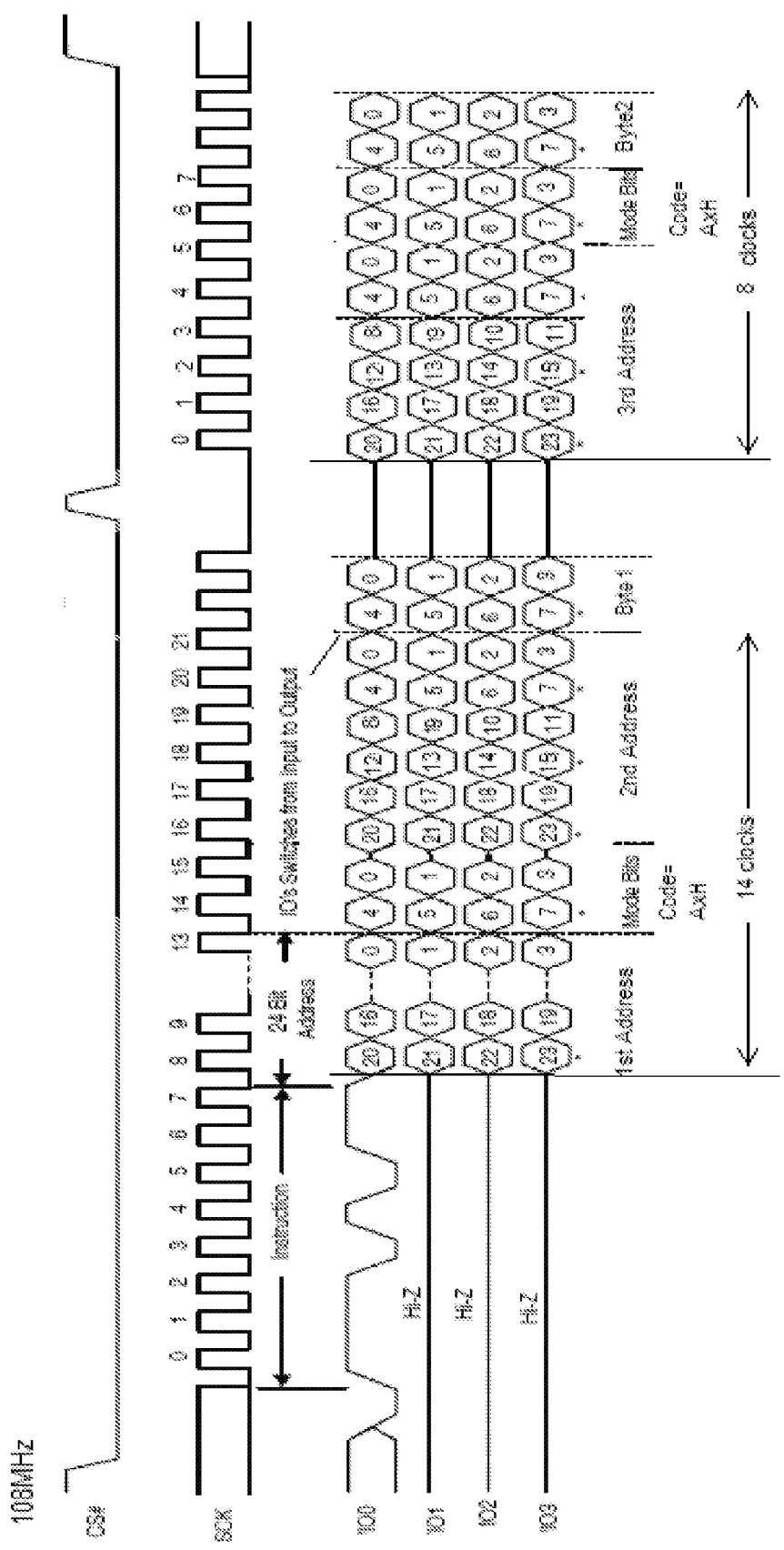
FIG. 33 shows a set of preferred timing waveforms of the serial SQI NOR in an 8 pin package according to the present invention.

FIG. 33 shows a set of preferred timing waveforms of the serial SQI NOR in an 8 pin package of the present invention. All input and output code data, the address data and command data are all synchronously clocked into SQI NOR flash through the four IO pins SIO[3:0] when CE# is held at ground level.

The length of clocks required depends on the memory density. Similar to the parallel NOR of the present invention, the address of the currently accessed data are latched earlier in unit of 4 bit sequentially before the output of the last accessed data. As a result, the random access speed of the SQI serial NOR is greatly improved in the present invention.

Figure 34:
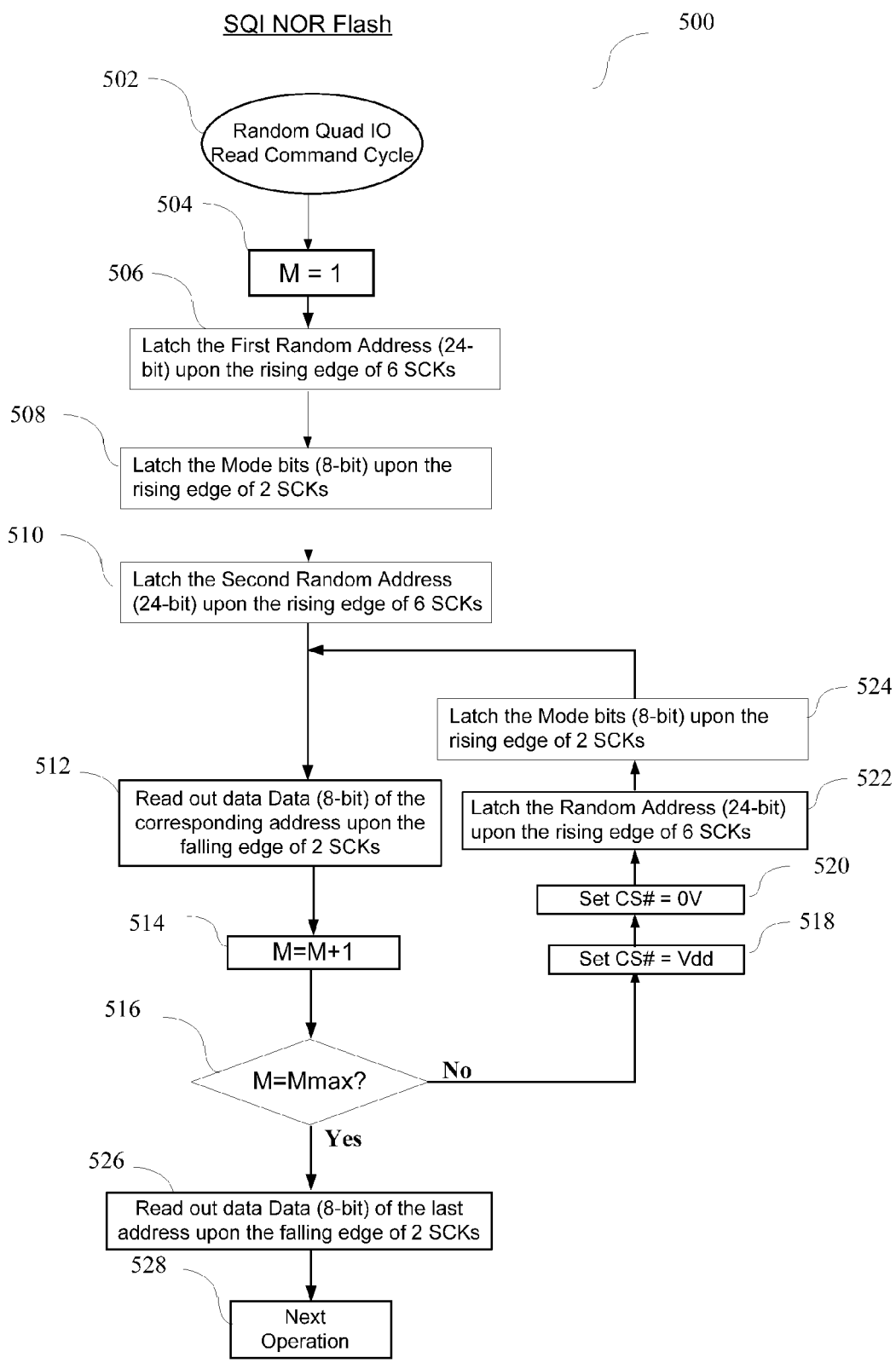
FIG. 34 shows the method and flow of the corresponding control sequence and timing waveforms of FIG. 33 for the serial SQI NOR in an 8 pin package according to the present invention.

FIG. 34 shows the novel method and flow 500 of the serial SQI NOR in an 8 pin package of present invention. Because the available I/O pins are only four which are much less than the 56 pins of a parallel NOR flash, more clocks are required to complete the down loading of the required bits of address, data and command sets.

The method 500 for the serial SQI NOR flash read operation of the present invention starts from a random quad I/O read command 502. In step 504, a counter M is reset to 1. The counter M is set to store the address number of the currently accessed memory data that are to be read out. Before the currently accessed memory data are outputted, the memory address has to be latched. According to the present invention, both first and second addresses are latched before the memory data of the first random address are read out. In step 506, the 24 bit first random address is latched upon the rising edges of 6 SCK clocks. The 8 mode bits are latched upon the rising edges of the next 2 SCK clocks in step 508, and the 24 bit second random address is latched upon the rising edges of following 6 SCK clocks in step 510.

In step 512, the 8 bit data of the currently accessed data are read out upon the falling edges of the 2 SCK clocks. In step 514, the counter is incremented by one. The incremented counter is checked in step 516. If the last accessed address is not reached in step 516, CS# is set to Vdd in step 518 and then set back to 0 V in step 520. The 24 bit next random address is latched upon the rising edges of the following 6 SCK clocks and the 8 mode bits are latched upon the rising edges of the next 2 SCK clocks as shown in steps 522 and 524 before the currently accessed data are outputted again in step 512.

If the accessed address is the last one in step 516, the 8 bit data of the last address are read out upon the falling edge of the next 2 SCK clocks in step 526 to complete the read command and the method is ready for the next memory operation in step 528.

Figure 35:
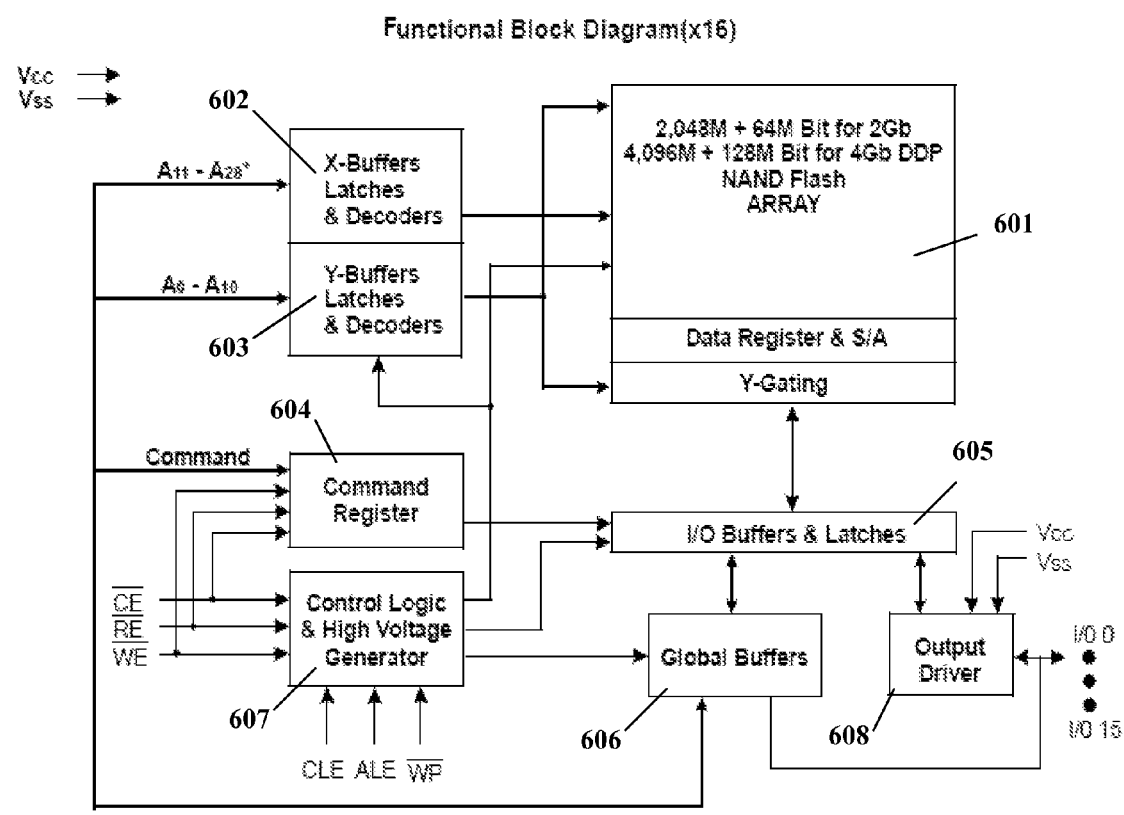
FIG. 35 shows a circuit block diagram of a 4 Gb DDR NAND flash device according to the conventional or present invention.

FIG. 35 shows a circuit functional block diagram (x16) for a 4 Gb DDR NAND flash memory. The NAND flash comprises a 4 Gb NAND flash cell array 601, internal latches and decoders of X and Y buffers 602, 603, command registers 604, I/O buffers and latches 605, global buffers 606, control logic and high voltage generator 607 with external control signals CE#, RE#, WE#, CLE, ALE, WP, output drivers 608 with 16 bi-directional output pins I/O0-I/O15, and power supply $V_{CC}$ and $V_{SS}$.

Figure 36:
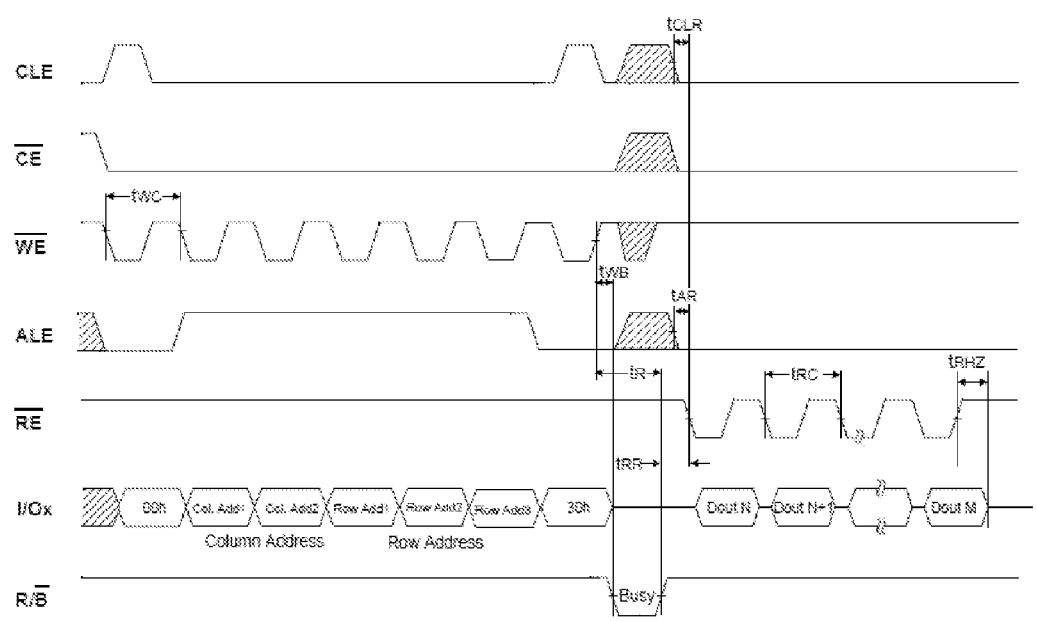
FIG. 36 shows a set of AC timing waveforms of a typical random read timing control sequence for accessing a page of DDR or regular NAND flash cells through 16 bi-directional I/Ox pins of a conventional NAND flash device.

FIG. 36 shows a set of conventional read AC timing waveforms of the DDR NAND flash shown in FIG. 35. The waveforms show a typical random read timing control sequence of accessing a page of the DDR NAND flash through the 16 bi-directional I/O pins, and how to access 16 bit NAND data from any given random page address. The selected page address consists of three 16 bit sub-addresses of the selected columns and rows. Each word line WL in the NAND flash cell array is accessed by a selected row.

Because the capacity of a NAND flash memory may be very high, up to 48 bit address has to be reserved for the row address of each selected random page. The 48 bit row address is divided into three consecutive address cycles of 16 address bits, Row Add1, Row Add2 and Row Add3, while the 32 bit column address is divided into two cycles of 16 address bits Col Add1 and Col Add2 as shown in FIG. 36. The input addresses are latched in the NAND flash upon the rising edge of WE# when CE#, CLE and RIB# are set to high. In order to read the data of a current random page out of the NAND flash, five sets of 16 bit current address data have to be latched on-chip before the memory data are read out. Every 16 bit memory data are continuously clocked out upon the falling edge of each RE# signal.

Figure 37:
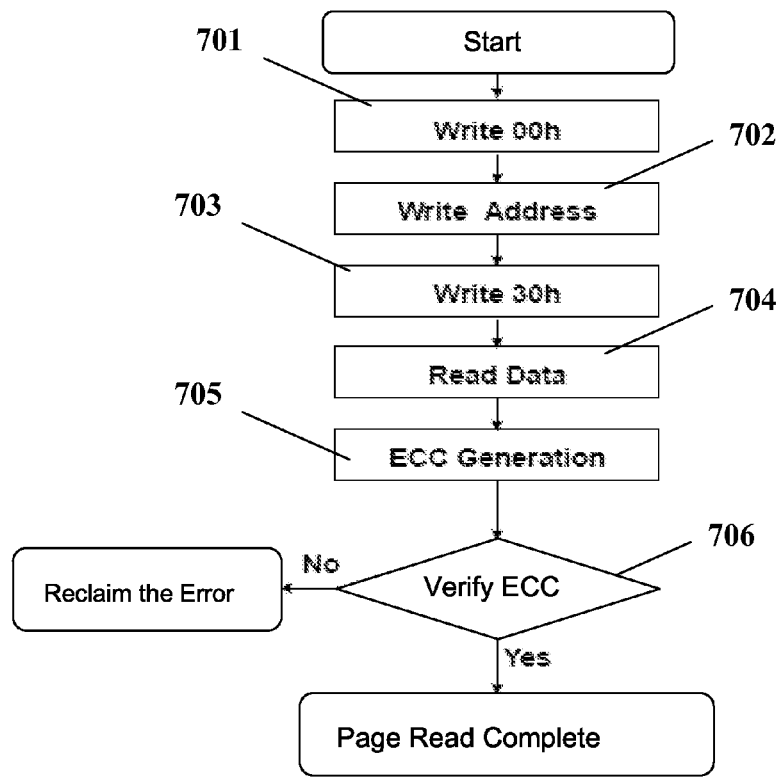
FIG. 37 shows the flow of the read operation of the conventional NAND flash device.

FIG. 37 shows the flow of the conventional page read operation of the DDR NAND flash corresponding to the timing waveforms of FIG. 36. In order to access the data of a selected page of a random row, the address bits of the accessed memory address have to be clocked in and latched first. Therefore, the flow of the read operation starts from top and a command "Write 00h" is written into the DDR NAND flash in step 701 to instruct the NAND flash to allow consecutive writing of the address of the selected page in step 702. After the completion of loading the address of the selected random page of the NAND flash in step 702, the NAND is then turned into the read mode by writing a command "Write 30h" into the NAND flash in step 703 to instruct it to allow the output of the accessed data in step 704.

Right after the read data has been successfully down loaded into on-chip or off-chip buffers in step 704, ECC generation is followed in step 705 to generate the corrected page data. If the error bits are checked and verified within the capability of the ECC algorithm in step 706, the correct page data are serially clocked out through 16 IO buffers to complete the page read operation. If the page data cannot be corrected by the ECC algorithm in step 706, a signal "Reclaim the Error" is issued.

Figure 38:
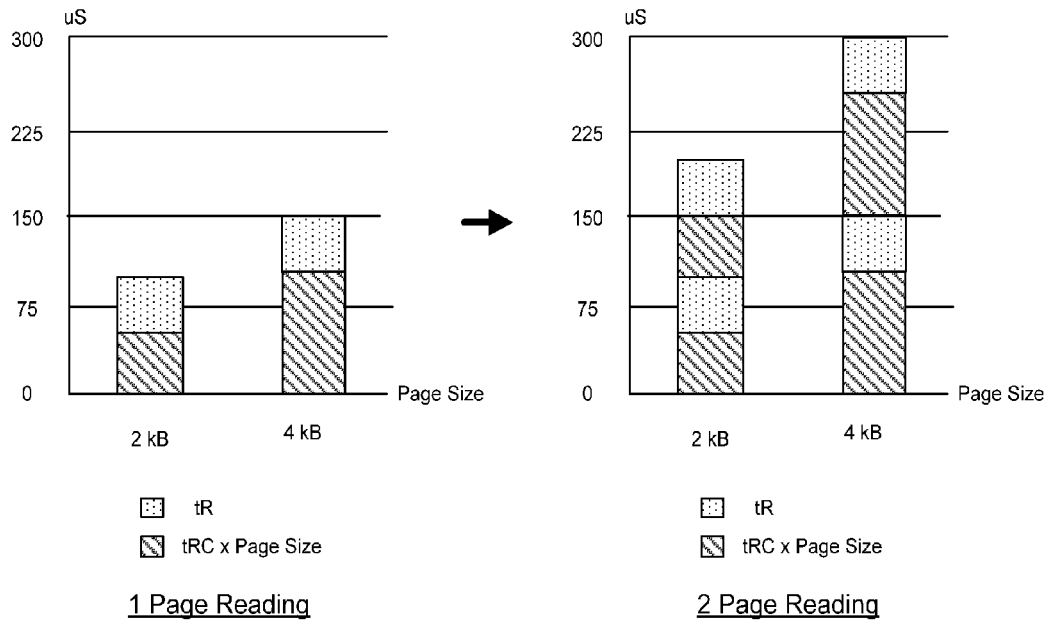
FIG. 38 shows the required time tR for reading one page of data out from NAND cells of the conventional NAND flash device and the required time tRC* for transferring the whole page data out through the 16 IO pins of the NAND flash device to a host processor.

FIG. 38 shows two charts for the reading time required in the conventional read operation of the DDR NAND flash. The left chart shows the required time tR for reading one page of cells out from the NAND flash and the required time tRC*Page Size for transferring the whole page of data out through the 16 IO pins of the NAND flash to a host processor. As can be seen, when the page size increases from 2 KB to 4 KB, the required time tR for reading the NAND flash array is constant. However, the required transferring time tRC*Page Size is doubled.

In the conventional page read operations, when two random pages are read, the first random page address is latched first, the page data of first accessed page are sent out continuously, the second random page address is then latched and the page data of the second accessed page are sent out subsequently. The right chart of FIG. 38 shows how the required time tR and tRC*Page Size increase respectively for reading two random pages of NAND cells with 2 KB and 4 KB page sizes.

Figure 39:
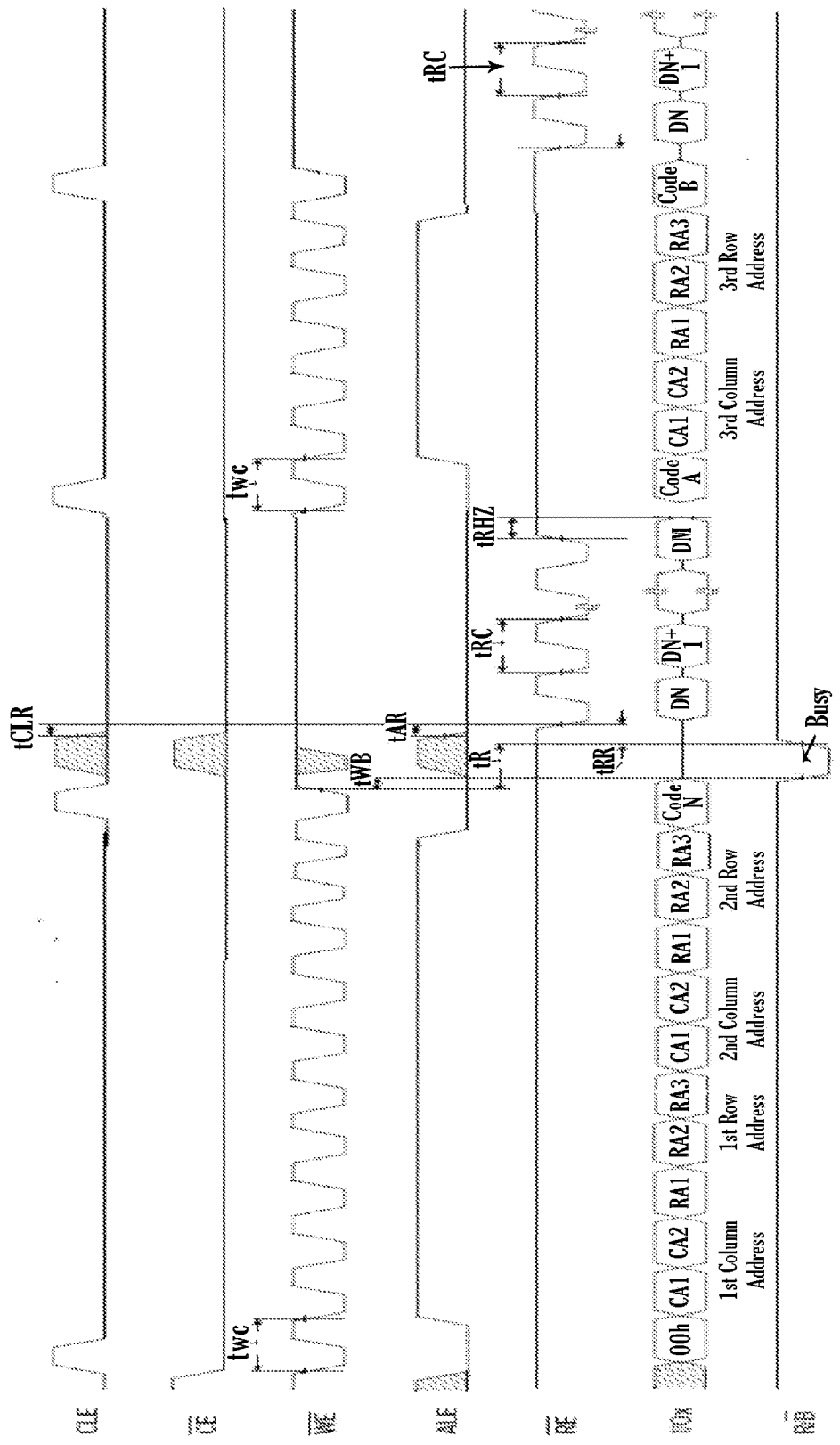
FIG. 39 shows a set of AC timing waveforms of a typical random read timing control sequence for accessing a page of NAND flash cells through 16 bi-directional I/Ox pins of the NAND flash device according to the present invention.

FIG. 39 shows a set of preferred read AC timing waveforms of a DDR or regular NAND flash according to the present invention. The waveforms show a preferred random page read timing control sequence of accessing more than two pages of the DDR NAND flash through the 16 bi-directional I/O pins, and how to access 16 bit NAND data from any given random page address according to the present invention.

As described above, the conventional random page read operation only latch and load the random page address of a currently accessed page before the currently accessed page data are sent out. In contrast, the random page read operation of this invention, the addresses of one or more random pages to be read are preferably latched and loaded into the NAND flash before the memory data of the $1^{st}$ accessed page are read out. As a result, the time delay of tR in the conventional random page read operation can be totally eliminated because the next random page address has been pre-latched before the currently accessed page data are sent out.

As shown in FIG. 39, the column address Col Add1 and Col Add2 and the row address Row Add1, Row Add2 and Row Add3 of the $1^{st}$ random page are first loaded and then the column address Col Add1 and Col Add2 and the row address Row Add1, Row Add2 and Row Add3 of the $2^{nd}$ random page are latched through the 16 I/O pins before the memory data of the $1^{st}$ accessed page are sent out. According to the present invention, multiple addresses of random pages can be pre-latched before reading out the memory data of the first accessed page, and the data of multiple random pages can be read out one by one. The total number of addresses of multiple pages to be latched depends on the depth of the stack registers of address buffers.

Figure 40:
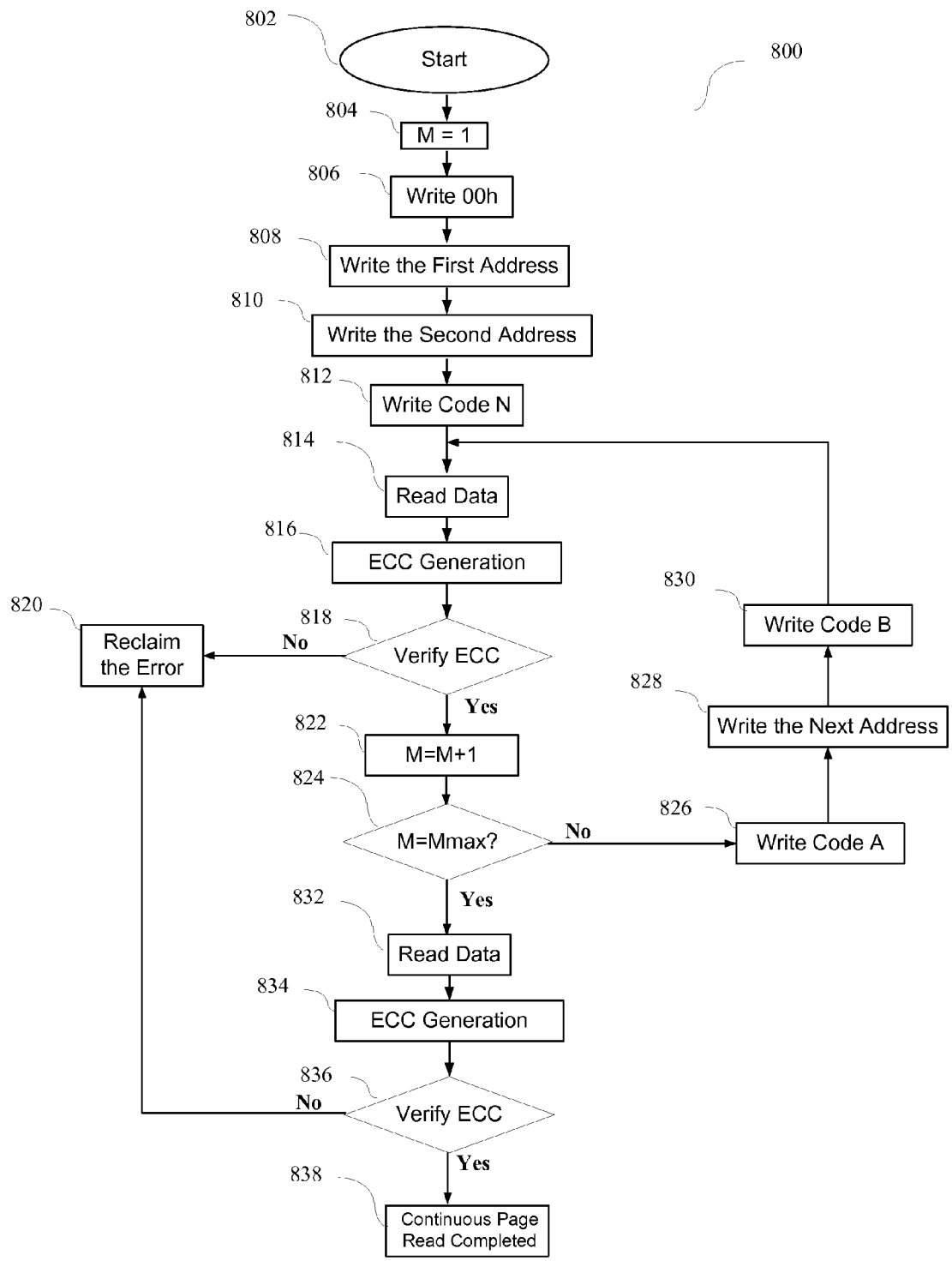
FIG. 40 shows the flow of the read operation corresponding to the timing control sequence of FIG. 39 according to the present invention.

FIG. 40 shows the flow of the preferred page read operation of the DDR NAND flash corresponding to FIG. 39 according to the present invention. In order to flexibly access the data of a selected random page of multiple random rows, the accessed address bits have to be clocked in and latched first. The flow of the page read start with the page read command in step 802. A counter M is reset to 1 in step 804. The counter M is set to store the address number of the page address that are to be accessed.

A command "Write 00h" is written into the DDR NAND flash in step 806 to instruct the NAND flash to allow consecutive writing of the address of the first random page in step 808. The address of the second random page is also loaded immediately after the address of the first random page has been written as shown in step 810. The consecutive row addresses are written in and latched one by one in on-chip stack registers of the NAND flash in step 810. Although the flow shows that only two random page addresses are written consecutively, more random row addresses can be written in if the NAND flash has deeper stack registers to allow storage of more than two addresses.

After the two or more row addresses are written in the NAND flash, the 16 bi-directional IO buffers are turned into output buffers to allow the accessed page data to be sent out. This is done by writing the read command "Code N" in as shown in step 812, and then the memory data of the $1^{st}$ page (currently accessed page) are read out in step 814. The first whole page of page data are then read out from NAND cell array at a time and then loaded to the on-chip page buffers with the same data width. The on-chip or off-chip ECC hardware or software tools are used to read the whole page data out from the page buffer and verify it against the ECC algorithm in step 816.

If the number of error bits are verified and are within the correction capability of the build-in ECC algorithm in step 818, the whole page data of the first accessed page are forwarded to the 16 IO buffers one by one. If the page data cannot be corrected by the ECC algorithm in step 818, a signal "Reclaim the Error" is issued in step 820.

The counter M is incremented by 1 in step 822 and then checked in step 824 to see if the page address to be accessed is the last one, i.e., M equals to the address number Mmax of the last random page address to be accessed. If the last page address has not been reached yet, the next random address has to be loaded. This is done by wiring the command "Code A" into the NAND flash in step 826 to instruct the NAND flash to allow consecutive writing of the address of the next random page in step 828. After the next page address has been loaded, the command "Code B" is written into the NAND flash in step 830 so that the memory data of the currently accessed page can be read out in step 814.

If the last page address has been reached in step 824, no more address has to be loaded in again. The memory data of the last page to be accessed have to be read out in step 832. The on-chip or off-chip ECC hardware or software tools are used to read the whole page data out from the page buffer and verify it against the ECC algorithm in step 834. If the number of error bits are verified and are within the correction capability of the build-in ECC algorithm in step 836, the whole page data of the first accessed page are forwarded to the 16 IO buffers one by one. If the page data cannot be corrected by the ECC algorithm in step 836, a signal "Reclaim the Error" is issued in step 820.

It is worth pointing out that in the flow in FIG. 6, only at the beginning of the read operation, two or more random row addresses have to be loaded. Only one next page address has to be loaded in step 828 before the page data of the currently accessed page are read out again in step 814. At the end of the read operation in the present invention, the memory data of two random page are read out consecutively to complete the read cycle of the present invention.

Figure 41:
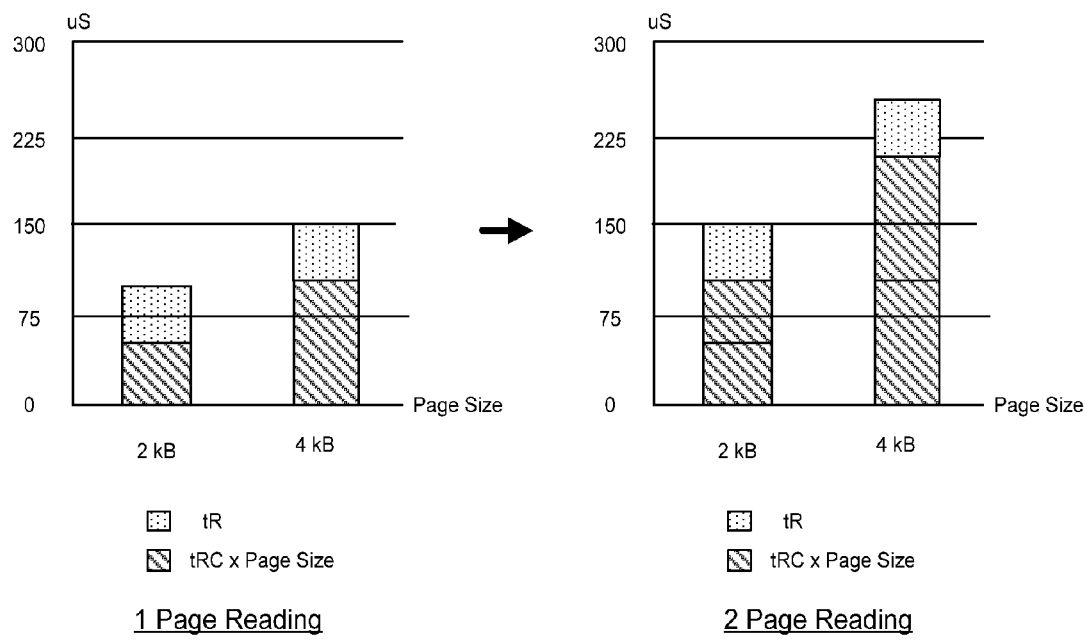
FIG. 41 shows the required time tR for reading one page of data out from NAND cells of the NAND flash device according to the present invention and the required time tRC* for transferring the whole page data out through the 16 IO pins of the NAND flash device to a host processor.

FIG. 41 shows two charts for the reading time required in the read operation of the DDR NAND flash according to the present invention. The left chart shows the required time tR for reading one page of cells out from the NAND flash and the required time tRC*Page Size for transferring the whole page of data out through the 16 IO pins of the NAND flash to a host processor. As can be seen, when the page size increases from 2 KB to 4 KB, the required time tR for reading the NAND flash array is constant. However, the required transferring time tRC*Page Size is doubled. This shows that the required time is identical to the conventional read operation shown in FIG. 38.

When multiple random pages are read, the read operation of the present invention can reduce both the required time tR for reading multiple pages of cells and the required time tRC*Page Size for transferring the multiple pages of data out as shown in the right chart of FIG. 41. Because addresses of more random pages are latched before the page data are read out, more time savings can be achieved and the system software design can be drastically simplified. As a result, the total read speed of the NAND flash is greatly improved.

In various embodiments described above, a parallel nonvolatile memory interface bus provides for communication of commands, address, and write data to a slave nonvolatile memory device and receives read data and device status from the slave nonvolatile memory device to a master host device. The slave nonvolatile memory device may have multiple nonvolatile memory arrays each with independent address, control, status, and data control circuitry. Further, in various embodiments, the NOR flash may be a NAND like dual charge retaining transistor NOR flash nonvolatile memory array.

The parallel nonvolatile memory interface bus includes connections that provide a master clock signal, a chip enable signal, and a parallel data signal to the slave nonvolatile memory device from a parallel data bus transmitted from the master host device. The master clock signal captures the control signals received from the parallel data bus. The control signals are decoded to activate the nonvolatile memory device and to determine the commands to be executed by the nonvolatile memory device. The decoded commands are transmitted for execution by the nonvolatile memory device. The data signals are received from the parallel data bus for distribution to selected locations within the nonvolatile memory device.

The address signal designates the location of the data to be read or written to selected locations within the nonvolatile memory device from the parallel data bus is received and decoded. In various embodiments, data signals concurrently read from selected locations of the nonvolatile memory device are transmitted on the parallel data bus.

In various embodiments, the control signals command that a read operation be executed wherein two separate addresses are received and decoded separately to define a row address and a column address within one of the multiple nonvolatile memory arrays. One address of the two separate addresses defining the row address is transferred directly to a row latching drive and the other address of the two separate addresses defining the column address is transferred to a column latching driver of the selected one of the multiple nonvolatile memory arrays. The data located at the location designated by the two separate addresses is transferred to the parallel data bus.

It will be apparent to those skilled in the art that various modifications and variations can be made in the flash memory array by using a diode to connect the source node of each individual memory cell to one common source line according to the present invention. It is intended that the embodiments described above be considered as exemplary only, with a true scope of the disclosed embodiments being indicated by the following claims and their equivalents.

What is claimed is:

1. A method of executing a memory operation command for accessing memory data of a plurality of memory addresses of a memory device, comprising the orderly steps of:
    (a) latching a first memory address of the plurality of memory addresses into stacked registers of the memory device;

(b) latching a second memory address of the plurality of memory addresses into the stacked registers;
(c) accessing the memory data of a current memory address in the stacked registers and removing the current memory address from the stacked registers, the current memory address being the memory address latched earliest in the stacked registers immediately before being removed;
(d) checking if a last memory address of the plurality of memory addresses has been latched or not;
(e) latching a next memory address of the plurality of memory addresses not latched yet into the stacked registers and returning to step (c) if the last memory address has not been latched; otherwise, proceeding to step (f); and
(f) accessing the memory data of the memory address still latched in the stack registers and removing the memory address from the stacked registers to complete the memory operation command.

2. The method according to claim 1, wherein the memory operation command is an asynchronous mode read command for reading the memory data of a parallel NOR flash memory device.

3. The method according to claim 1, wherein the memory operation command is an asynchronous mode read command for reading the memory data of a parallel pseudo SRAM device.

4. The method according to claim 1, wherein the memory operation command is a synchronous mode read command for reading the memory data of a parallel NOR flash memory device.

5. The method according to claim 1, wherein the memory operation command is a synchronous mode read command for reading the memory data of a parallel pseudo SRAM device.

6. The method according to claim 1, wherein the memory operation command is an asynchronous mode read command for reading the memory data of a serial SQI NOR flash device.

* * * * *